United States Patent
Shindo et al.

(10) Patent No.: US 7,896,973 B2
(45) Date of Patent: Mar. 1, 2011

(54) SUBSTRATE PROCESSING APPARATUS AND SUBSTRATE PROCESSING METHOD

(75) Inventors: Naoki Shindo, Nirasaki (JP); Tadashi Iino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 847 days.

(21) Appl. No.: 10/779,397

(22) Filed: Feb. 13, 2004

(65) Prior Publication Data
US 2005/0087133 A1 Apr. 28, 2005

Related U.S. Application Data

(62) Division of application No. 10/034,520, filed on Dec. 28, 2001, now Pat. No. 6,729,041.

(30) Foreign Application Priority Data

| Dec. 28, 2000 | (JP) | ................................. 2000-401466 |
| Jan. 17, 2001 | (JP) | ................................. 2001-009207 |
| Jan. 17, 2001 | (JP) | ................................. 2001-009208 |

(51) Int. Cl.
   *B08B 3/00* (2006.01)
   *B08B 7/04* (2006.01)
(52) U.S. Cl. ................. 134/30; 134/26; 134/31; 134/34; 134/35; 134/37; 134/902
(58) Field of Classification Search .................... 134/11, 134/19, 21, 26, 30, 31, 34, 35, 37, 902
See application file for complete search history.

(56) References Cited

U.S. PATENT DOCUMENTS

| 4,150,494 | A | | 4/1979 | Rothchild |
| 4,977,688 | A | * | 12/1990 | Roberson et al. ................. 34/92 |
| 5,051,135 | A | | 9/1991 | Tanaka et al. |
| 5,111,698 | A | | 5/1992 | Banholzer et al. |
| 5,120,370 | A | * | 6/1992 | Mori et al. ................. 134/22.15 |
| 5,254,367 | A | | 10/1993 | Matsumura |
| 5,288,333 | A | * | 2/1994 | Tanaka et al. ................... 134/31 |
| 5,735,962 | A | * | 4/1998 | Hillman ........................... 134/3 |

(Continued)

FOREIGN PATENT DOCUMENTS

DE   10036867 A1 *  5/2001

(Continued)

OTHER PUBLICATIONS

Notice of Allowance mailed Feb. 24, 2009, for KR Patent Application No. 10-2001-0086491, two pages.

*Primary Examiner* — Alexander Markoff
(74) *Attorney, Agent, or Firm* — Morrison & Foerster LLP

(57) ABSTRACT

This substrate processing apparatus supplies wafers W accommodated in a closed processing container 10 with ozone gas and steam for processing the wafers W. The apparatus includes an ozone-gas generator 40 for supplying the ozone gas into the processing container 10, a steam generator 30 for supplying the steam into the processing container 10 and a steam nozzle 35 arranged in the processing container 10 and connected to the steam generator 30. The steam nozzle 35 is equipped with a nozzle body 35a having a plurality of steam ejecting orifices 35f formed at appropriate intervals and a heater 35h for preventing dewdrops of the steam from being produced in the nozzle body 35a. Consequently, it is possible to prevent the formation of dewdrops of solvent steam, which may produce origins of particles in the closed processing container, unevenness in cleaning (etching), etc., and also possible to improve the processing efficiency.

7 Claims, 18 Drawing Sheets

U.S. PATENT DOCUMENTS

| | | | |
|---|---|---|---|
| 5,940,985 A * | 8/1999 | Kamikawa et al. | 34/471 |
| 5,954,911 A | 9/1999 | Bergman et al. | |
| 6,146,469 A * | 11/2000 | Toshima | 134/37 |
| 6,158,141 A | 12/2000 | Asada et al. | |
| 6,164,297 A | 12/2000 | Kamikawa | |
| 6,199,298 B1 | 3/2001 | Bergman | |
| 6,328,809 B1 * | 12/2001 | Elsawy et al. | 134/3 |
| 6,350,322 B1 * | 2/2002 | Yates | 134/3 |
| 6,401,361 B1 | 6/2002 | Chen et al. | |
| 6,453,685 B2 | 9/2002 | Ota et al. | |
| 6,508,258 B1 * | 1/2003 | Lorimer | 134/102.1 |
| 6,613,692 B1 * | 9/2003 | Toshima et al. | 438/745 |
| 6,799,584 B2 * | 10/2004 | Yogev et al. | 134/1.3 |
| 7,410,543 B2 * | 8/2008 | Toshima et al. | 134/2 |

FOREIGN PATENT DOCUMENTS

| KR | 10-1997-0059323 A | 8/1997 |
|---|---|---|

* cited by examiner

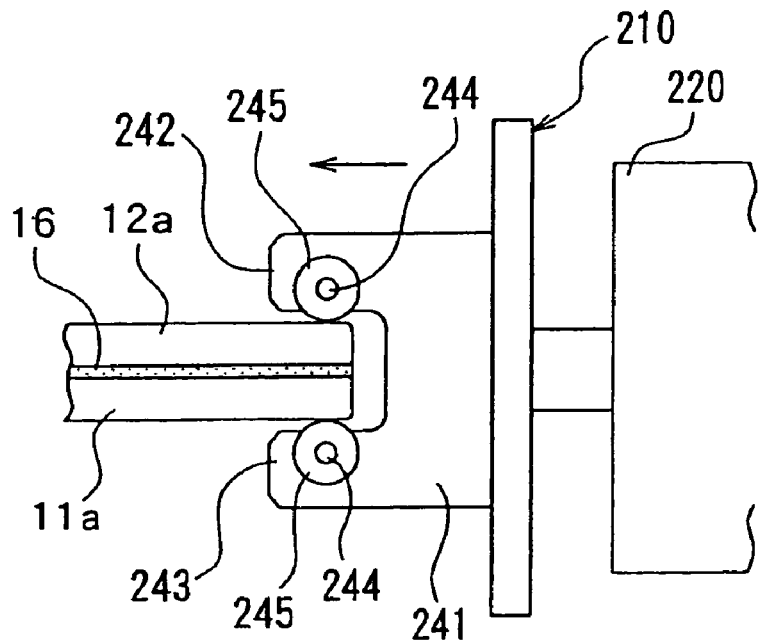
F I G. 8A
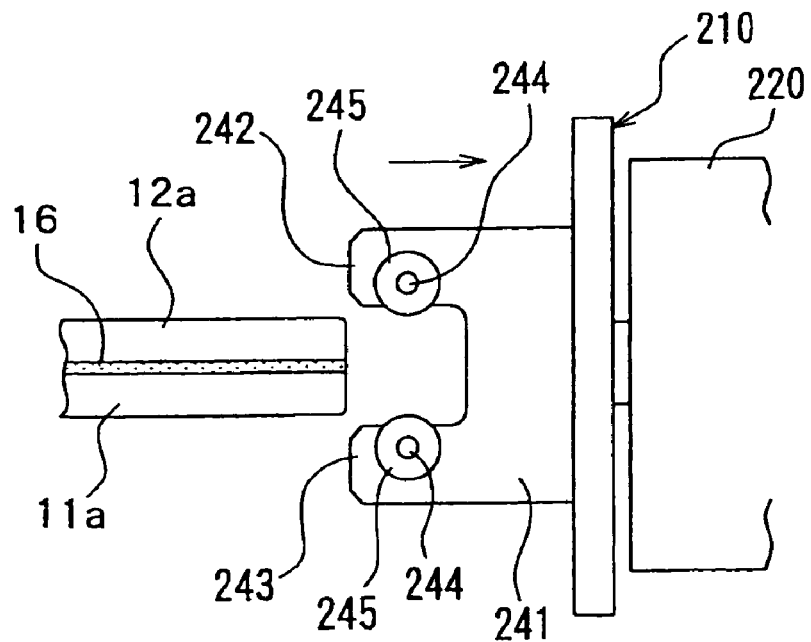
F I G. 8B

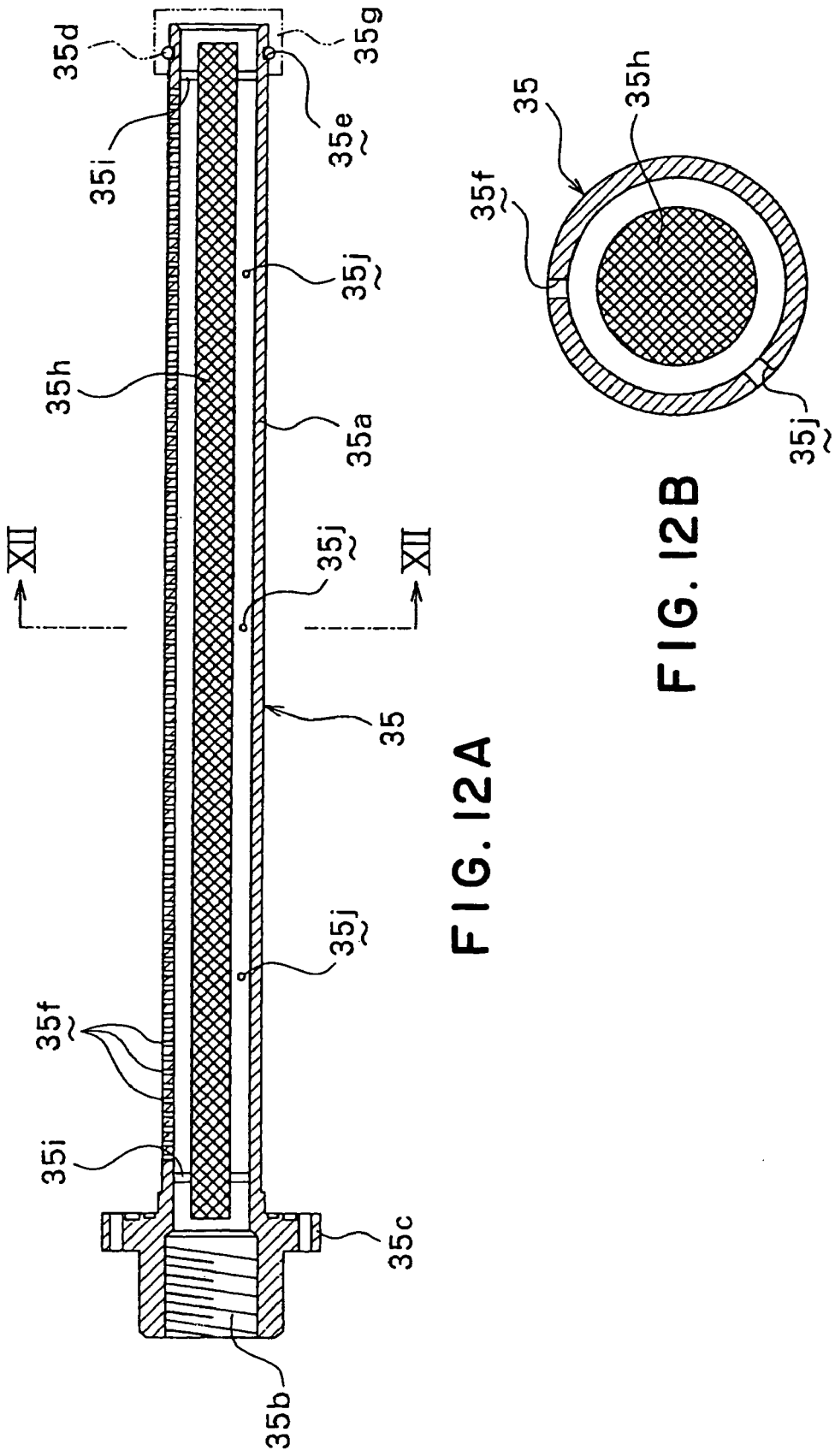

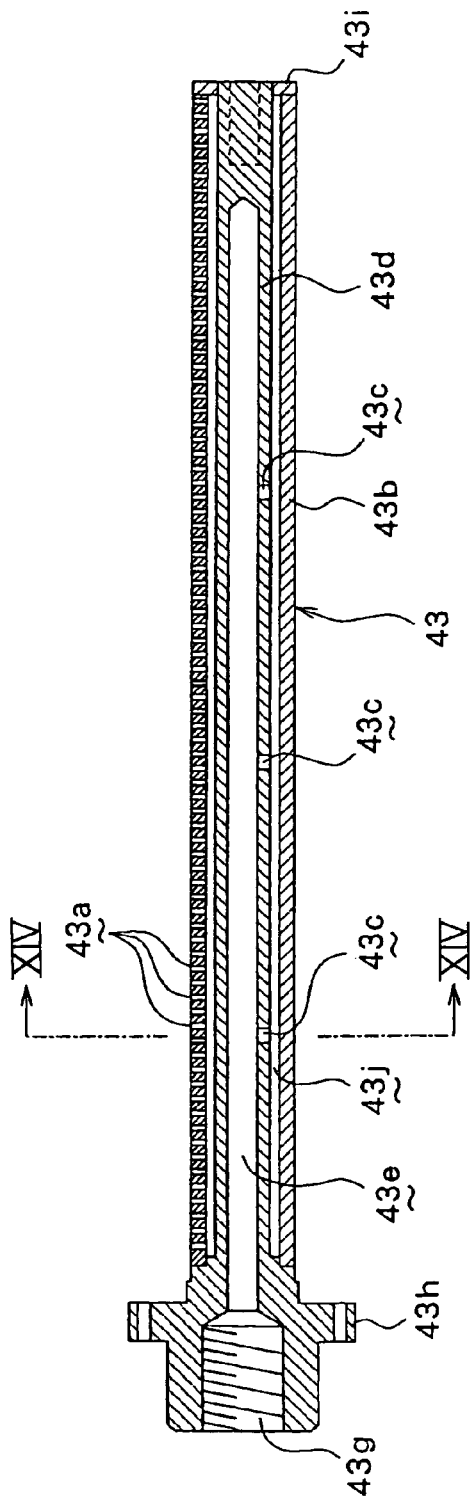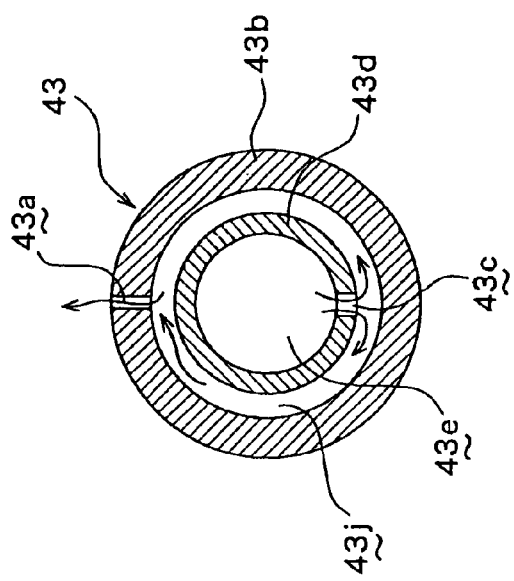
FIG. 13
FIG. 14

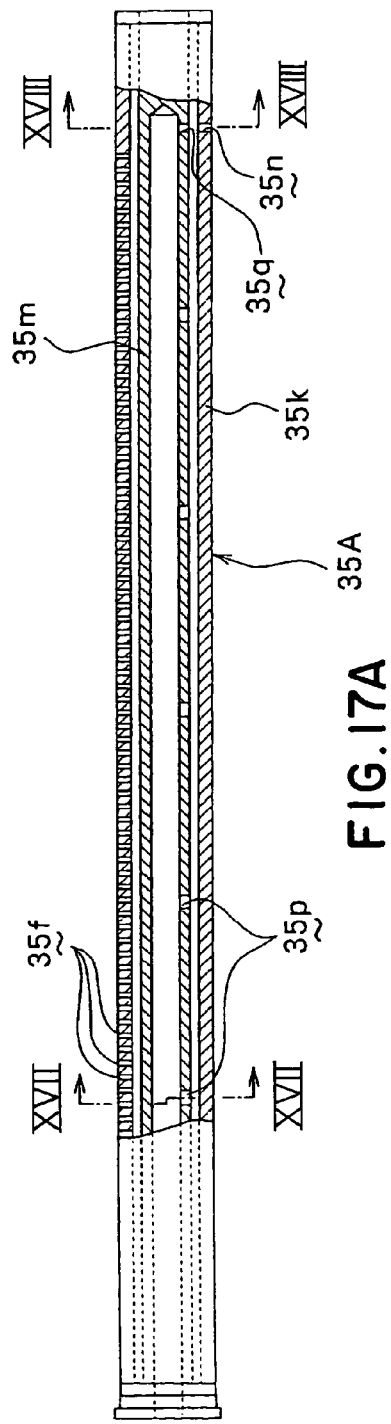
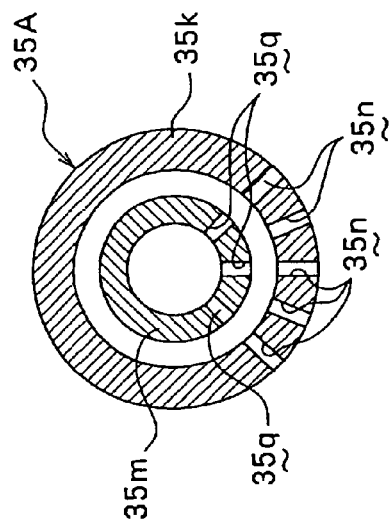
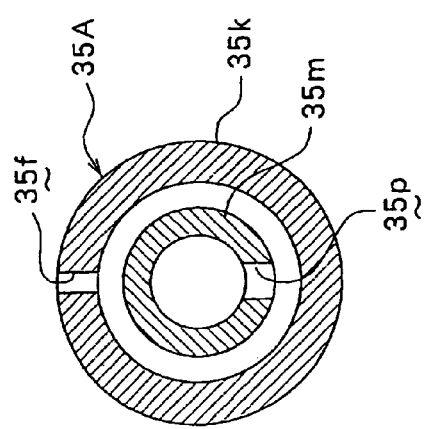
FIG. 17A
FIG. 17C
FIG. 17B

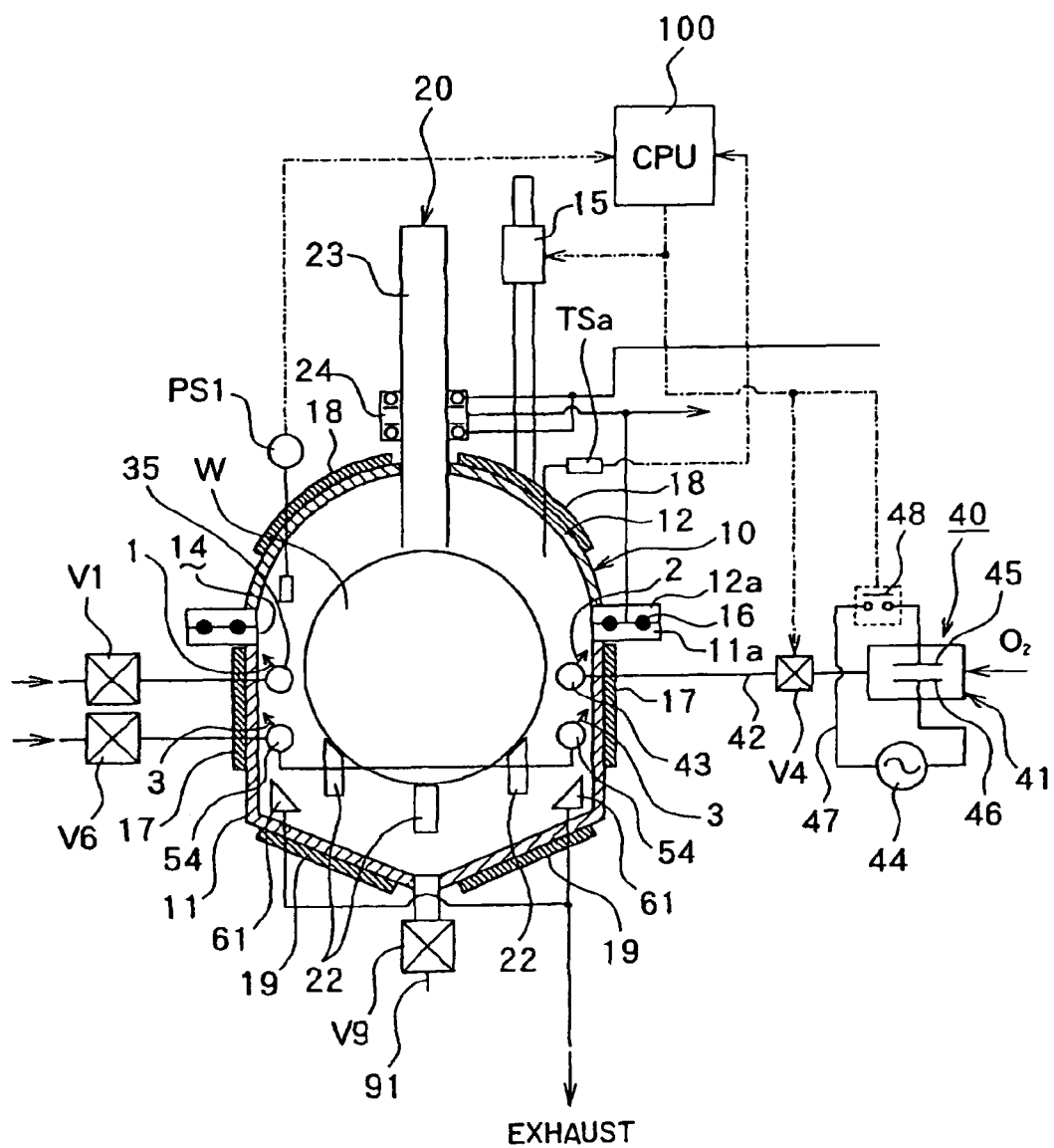
F I G. 20

SUBSTRATE PROCESSING APPARATUS AND SUBSTRATE PROCESSING METHOD

CROSS-REFERENCE TO RELATED APPLICATION

This application is a division of Application Ser. No. 10/034,520, filed on Dec. 28, 2001, now U.S. Pat. No. 6,729,041 which application is specifically incorporated herein, in its entirety, by reference.

BACKGROUND OF THE INVENTION

1. Technical Field of the Invention

This invention relates to a substrate processing apparatus and a substrate processing method. More in detail, the invention relates to substrate processing apparatus and method for processing substrates, for example, semiconductor wafers, glass substrates for LCD, etc. with a processing gas, such as ozone gas, the substrates being accommodated in a processing container capable of establishing a closed atmosphere therein.

2. Description of the Related Art

Generally, the manufacturing process for semiconductor devices comprises the following steps of: applying photo-resist on substrates, for example, semiconductor wafers and LCD baseplates; transferring a circuit pattern, which has been scaled down by the photo-lithography technique, to the above photo-resist; developing this pattern; and thereafter removing the photo-resist from the wafers etc. Note, the semiconductor wafers will be simply referred as "wafers", hereinafter.

As means for removing the photo-resist, there exists a substrate cleaning apparatus. In the prior art cleaning apparatus, the operation to remove the photo-resist from the substrates is accomplished by dipping the wafers etc. into a cleaning bath filled up with a chemical liquid generally called "SPM" (mixture of $H_2SO_4$ and $H_2O_2$). To the contrary, there has been a general demand to use a solution of ozone ($O_3$) for the removal operation since its effluent process from a factory is preferable in view of the protection of the environment. In using the solution of ozone ($O_3$) for the removal operation, there is generally employed a cleaning method that the wafers etc. are dipped into a cleaning bath filled up with a solution having ozone melted thereinto, which is so-called "dip" type cleaning method. In this method, the photo-resist on the wafers is oxidized and dissolved into carbon dioxide and water etc. by oxygen atomic radicals in the solution.

Incidentally, according to the above-mentioned method, the ozone gas of high concentration is firstly dissolved into pure water in the form of bubbles thereby to produce the "ozone" solution and thereafter, the resultant solution is supplied into the cleaning bath. Therefore, there sometimes arises a situation that ozone(s) in the solution gradually disappear during the transportation, so that the concentration of ozone is reduced to cause an insufficient removal of the photo-resist. Additionally, the removal operation by dipping the wafers etc. into the ozone solution cannot afford the reaction (oxidation of resist) at high speed. Because, the removal operation is apt to make the quantity of ozone(s) for the resist insufficient although ozone(s) successively disappears as the result of the reaction with the resist.

In place of such a cleaning method for cleaning the wafers etc. by dipping them into the ozone solution, there is newly proposed a cleaning (etching) method for removing the resist from the wafers etc. while using a processing gas, for example, mixture of ozone gas and vapor of solvent, for example, steam. Note, in this specification, the above vapor of solvent will be referred "solvent vapor", hereinafter. According to this cleaning (etching) method, the processing gas, for example, ozone gas is supplied to the wafers accommodated in a closed processing container where the resist is removed from the wafers.

However, the substrate processing apparatus employing the above-mentioned cleaning method has problems to be solved. First, dewdrops of the solvent vapor are produced in a solvent-vapor nozzle disposed in the processing container, thereby causing sources of bacteria and particles. Second, the dewdrops are scattered to stick to the wafers at the time of ejecting the solvent vapor, thereby causing the wafers to be cleaned with unevenness. Additionally, the solvent vapor is condensed into dewdrops of water that sticks to an upside inner wall of the processing container. Then, the waterdrops fall onto the wafers to cause the sources of particles. Further, the dewdrops of water are scattered into the processing container, causing the wafers to be cleaned with unevenness.

Since the above-mentioned substrate processing apparatus includes a steam generator whose inside pressure is constant (almost atmospheric pressure), there exists a limit in producing the steam. Therefore, under a situation that an interior of the processing container is pressurized more than the atmospheric pressure, then a problem arises in that the quantity of solvent vapor to be supplied into the processing container decreases, so that the processing capability of the apparatus itself is lowered.

SUMMARY OF THE INVENTION

Under such a circumference as mentioned above, an object of the present invention is to provide a substrate processing apparatus that restricts the formation of dewdrops of the solvent vapor which may produce sources of particles etc. or cause cleaning (etching) unevenness etc. in the processing container thereby to improve the processing efficiency of the apparatus. Additionally, another object of the present invention is to provide substrate processing method and apparatus by which an amount of solvent vapor generated is so adjusted as to supply the processing container with an appropriate amount of solvent vapor thereby to improve the processing efficiency of the apparatus.

In order to attain the above objects, according to the first aspect of the present invention, there is provided a substrate processing apparatus for supplying a substrate to be processed with processing gas and solvent vapor, comprising:
   a processing container for accommodating the substrate therein;
   a processing-gas supplier for supplying the processing gas into the processing container;
   a solvent-vapor generator for generating the solvent vapor to be supplied into the processing container; and
   a solvent-vapor nozzle arranged in the processing container and also connected to the solvent-vapor generator, wherein the solvent-vapor nozzle includes a nozzle body having a plurality of nozzle orifices formed at appropriate intervals and a condensation-proof mechanism for preventing dewdrops from being formed in an inside space of the nozzle body.

According to the second feature of the invention, the condensation-proof mechanism comprises a heater for heating the inside space of the nozzle body. Accordingly, it is possible to prevent the solvent-vapor from being condensed into dewdrops in the nozzle body. Also, there is no possibility that the dewdrops of water are scattered onto the substrates at the ejection of the solvent-vapor. Thus it is possible to restrict an outbreak of bacteria due to the formation of dewdrops in the nozzle body and an occurrence of particles due to the scattering of dewdrops.

According to the third feature of the invention, the condensation-proof mechanism comprises a drain port formed on the bottom of the nozzle body to communicate the inside space of the nozzle body with an outside thereof. Accordingly, the drain port can drain the dewdrops from the nozzle body to the outside, preventing the dewdrops of water from being scattered around at the ejection of the solvent-vapor. In connection, the nozzle body may be modified to have an inner pipe inserted thereinto through a clearance and also connected to the solvent-vapor generator, the inner pipe having communication holes formed on the opposite side of the nozzle orifices in the nozzle body. In such a case, the supplied solvent-vapor is ejected from the nozzle orifices after the vapor has entered into a clearance between the nozzle body and the inner pipe through the communication hole. Thus it is possible to eject the solvent-vapor from the nozzle orifices uniformly.

According to the fourth feature of the invention, the drain port is arranged on the side of one end of the nozzle body. The dewdrops collected on respective bottoms of the nozzle body and the inner pipe move toward the end of the nozzle body due to an ejection power of the solvent-vapor. Therefore, owing to the formation of the drain port on the side of the end of the nozzle body, it is possible to discharge the dewdrops of water with ease.

According to the fifth feature of the invention, the nozzle body is arranged beside a plurality of substrates in the processing container, and the drain port of the nozzle body is positioned outside the outermost one of the plural substrates. Thus it is possible to prevent the discharged dewdrops from being blown up to their adhesion to the substrate by air current in the processing container.

According to the sixth feature of the invention, the drain port is arranged multiple ports in the circumferential direction of the one end of the nozzle body.

According to the seventh feature of the invention, the drain port of the nozzle body is arranged so as not to face the substrate arranged in the processing container but to face the processing container's inner wall on the opposite side of the substrate. Thus it is possible to restrict an occurrence of particles, allowing a uniform cleaning of the substrate to be progressed furthermore.

According to the eighth feature of the invention, the substrate processing apparatus further comprises a heater arranged in the nozzle body.

According to the ninth feature of the invention, there is also provided a substrate processing apparatus for supplying a substrate to be processed with processing gas and solvent vapor, comprising:

a processing container for accommodating the substrate therein;

a processing-gas supplier for supplying the processing gas into the processing container;

a solvent-vapor generator for generating the solvent vapor to be supplied into the processing container; and a solvent-vapor nozzle arranged in the processing container and also connected to the solvent-vapor generator, wherein the processing container has its upper part formed with an inner wall which is reverse V-shaped so as to descend from the central part of the processing container toward both ends thereof. With this constitution, the apparatus allows the dewdrops of the solvent-vapor, which adhere to the upside inner wall of the processing container, to flow into both sides of the apparatus via inclined faces forming the upper part of the processing container. Therefore, it is possible to prevent the dewdrops adhering to the upside inner wall from falling and adhering to the substrate. Thus it is possible to restrict an occurrence of particles, allowing a uniform cleaning of the substrate to be progressed furthermore.

According to the tenth feature of the invention, the processing container is provided, in an upper part thereof, with a heater. Therefore, it is possible to prevent the dewdrops from adhering to the upside inner wall of the processing container. Thus it is possible to restrict an occurrence of particles, allowing a uniform cleaning of the substrate to be progressed furthermore.

According to the 11th. feature of the invention, the processing container includes a container body having an upper part provided with a loading/unloading port for loading and unloading the substrate, a container cover for closing up the loading/unloading port through a seal member, and a locking mechanism for fastening the container body to the container cover disengageably. Therefore, it is possible to close up the processing container certainly, allowing the processing efficiency to be improved.

According to the 12th. feature of the invention, there is also provided a substrate processing method for processing a substrate to be processed, by supplying processing gas and solvent vapor to the substrate accommodated in a processing container, the method comprising the steps of:

researching on a pressure of the solvent vapor in a condition before the solvent vapor is supplied into the processing container;

supplying the solvent vapor into the processing container on the basis of the pressure of the solvent vapor. Therefore, it is possible to supply the solvent-vapor of an optimum amount without being influenced by the pressure in the processing container and also possible to process the substrate with the solvent-vapor and the processing gas.

According to the 13th. feature of the invention, the researching step for the pressure of the solvent vapor in the condition before being supplied into the processing container, is carried out by firstly measuring a temperature of the solvent vapor in the condition before-being supplied into the processing container and secondly calculating the pressure from the detected temperature.

According to the 14th. feature of the invention, the researching step for the pressure of the solvent vapor in the condition before being supplied into the processing container is carried out by firstly measuring a temperature of a liquid solvent that can generate the solvent vapor to be supplied into the processing container and secondly calculating the pressure from the detected temperature.

According to the 15th. feature of the invention, the substrate processing method further comprises the step of supplying the processing gas into the processing container before supplying the solvent vapor into the processing container.

According to the 16th. feature of the invention, there is also provided a substrate processing method for processing a substrate to be processed, by supplying processing gas and solvent vapor to the substrate accommodated in a processing container, the method comprising the steps of:

supplying the processing gas into the processing container;

elevating a pressure of the solvent vapor before being supplied into the processing container higher than a pressure of the processing gas in the processing container; and supplying the solvent vapor, whose pressure has been elevated higher than the pressure of the processing gas in the processing container, into the processing container.

According to the 17th. feature of the invention, the substrate processing method further comprises the step of controlling the pressure of the solvent vapor so as to be higher than a pressure of an atmosphere in the processing container, under condition that the pressure of the solvent vapor before being supplied into the processing container becomes higher than the pressure of the processing gas in the processing container.

According to the 18th. feature of the invention, the step of controlling the pressure of the solvent-vapor so as to be higher than the pressure of the atmosphere in the processing container is carried, in a closed space where the solvent vapor before being supplied into the processing container is present, by releasing the closed space for a constant period to discharge the solvent vapor of a constant quantity from the closed space so that the pressure of the solvent vapor becomes less than a first pressure which is higher than the pressure of the processing gas in the processing container.

According to the 19th. feature of the invention, there is also provided a substrate processing apparatus for processing a substrate to be processed, by supplying processing gas and solvent vapor to the substrate accommodated in a processing container, the apparatus comprising:
  a processing-gas supplier for supplying the processing gas into the processing container;
  a solvent-vapor generator for generating the solvent vapor to be supplied into the processing container; and
  a pressure researcher for researching a pressure of the solvent vapor in the solvent-vapor generator.

According to the 20th. feature of the invention, the pressure researcher includes a temperature detector for detecting a temperature of the solvent vapor in the solvent-vapor generator and a pressure calculator for calculating a pressure of the solvent vapor in the solvent-vapor generator from the detected temperature. According to the 21st. feature of the invention, the pressure researcher includes a liquid-temperature detector for detecting a temperature of a liquid solvent in the solvent-vapor generator and a pressure calculator for calculating a pressure of the solvent vapor in the solvent-vapor generator from the detected temperature.

According to the 22nd. feature of the invention, there is also provided a substrate processing apparatus for processing a substrate to be processed, by supplying processing gas and solvent vapor to the substrate accommodated in a processing container, the apparatus comprising:
  a processing-gas supplier for supplying the processing gas into the processing container;
  a solvent-vapor generator for generating the solvent vapor to be supplied into the processing container;
  a first opening/closing unit interposed in a supply pipeline that supplies the solvent vapor generated in the solvent-vapor generator into the processing container;
  a second opening/closing unit interposed in a discharge pipeline branching from the supply pipeline on the upstream side of the first opening/closing unit;
  a pressure researcher for researching a pressure of the solvent vapor in the solvent-vapor generator; and
  a controller for controlling respective opening/closing operations of the first opening/closing unit and the second opening/closing unit on the basis of a detection signal outputted from the pressure researcher.

According to the 23rd. feature of the invention, the controller controls the opening/closing operation of the second opening/closing unit on the basis of the detection signal so as to maintain the pressure of the solvent vapor within a constant range.

According to the 24th. feature of the invention, there is also provided a substrate processing apparatus for processing a substrate to be processed, by supplying processing gas and solvent vapor to the substrate accommodated in a processing container, the apparatus comprising:
  a processing-gas supplier for supplying the processing gas into the processing container;
  a solvent-vapor generator for generating the solvent vapor to be supplied into the processing container;
  a first opening/closing unit interposed in a supply pipeline that supplies the solvent vapor generated in the solvent-vapor generator into the processing container;
  a second opening/closing unit interposed in a discharge pipeline branching from the supply pipeline on the upstream side of the first opening/closing unit;
  a temperature detector for detecting a temperature of the solvent vapor in the solvent-vapor generator; and
  a controller for controlling respective opening/closing operations of the first opening/closing unit and the second opening/closing unit on the basis of a detection signal outputted from the temperature detector.

According to the 25th. feature of the invention, the controller controls the opening/closing operation of the second opening/closing unit on the basis of the detection signal so as to maintain the temperature of the solvent vapor within a constant range.

According to the 26th. feature of the invention, there is also provided a substrate processing apparatus for processing a substrate to be processed, by supplying processing gas and solvent vapor to the substrate accommodated in a processing container, the apparatus comprising:
  a processing-gas supplier for supplying the processing gas into the processing container;
  a solvent-vapor generator for generating the solvent vapor to be supplied into the processing container;
  a first opening/closing unit interposed in a supply pipeline that supplies the solvent vapor generated in the solvent-vapor generator into the processing container;
  a second opening/closing unit interposed in a discharge pipeline branching from the supply pipeline on the upstream side of the first opening/closing unit;
  a temperature detector for detecting a temperature of a liquid solvent in the solvent-vapor generator; and
  a controller for controlling respective opening/closing operations of the first opening/closing unit and the second opening/closing unit on the basis of a detection signal outputted from the temperature detector.

According to the 27th. feature of the invention, the controller controls the opening/closing operation of the second opening/closing unit on the basis of the detection signal so as to maintain the temperature of the liquid solvent within a constant range.

BRIEF DESCRIPTION OF THE DRAWINGS

FIG. 8A is a schematic side view of a second engagement part of the locking mechanism of FIG. 5 showing its engaging condition, FIG. 8B is a schematic side view of the second engagement part of the locking mechanism of FIG. 5 showing its disengaging condition;

FIG. 12A is a sectional view showing a steam nozzle of the invention, FIG. 12B is an enlarged sectional view taken along a line XII-XII of FIG. 12A;

FIG. 13 is a sectional view showing an ozone-gas nozzle of the invention;

FIG. 14 is an enlarged sectional view taken along a line XIV-XIV of FIG. 13;

FIG. 17A is a sectional view showing the steam nozzle of another embodiment of the invention, FIG. 17B is an enlarged sectional view taken along a line XVII-XVII of FIG. 17A, FIG. 17C is an enlarged sectional view taken along a line of XVIII-XVIII of FIG. 17A;

FIG. 20 is a sectional view showing of the essential part of the substrate processing apparatus provided with a container cover having a reverse-U shaped section.

DESCRIPTION OF THE PREFERRED EMBODIMENT

With reference to FIGS. 1 to 20, embodiments of the present invention will be described below.

In the following embodiments, we describe a case of removing photo-resist from semiconductor wafers W by using an ozone gas. Note, the semiconductor wafers W will be referred "wafers W", hereinafter.

Figure 1:
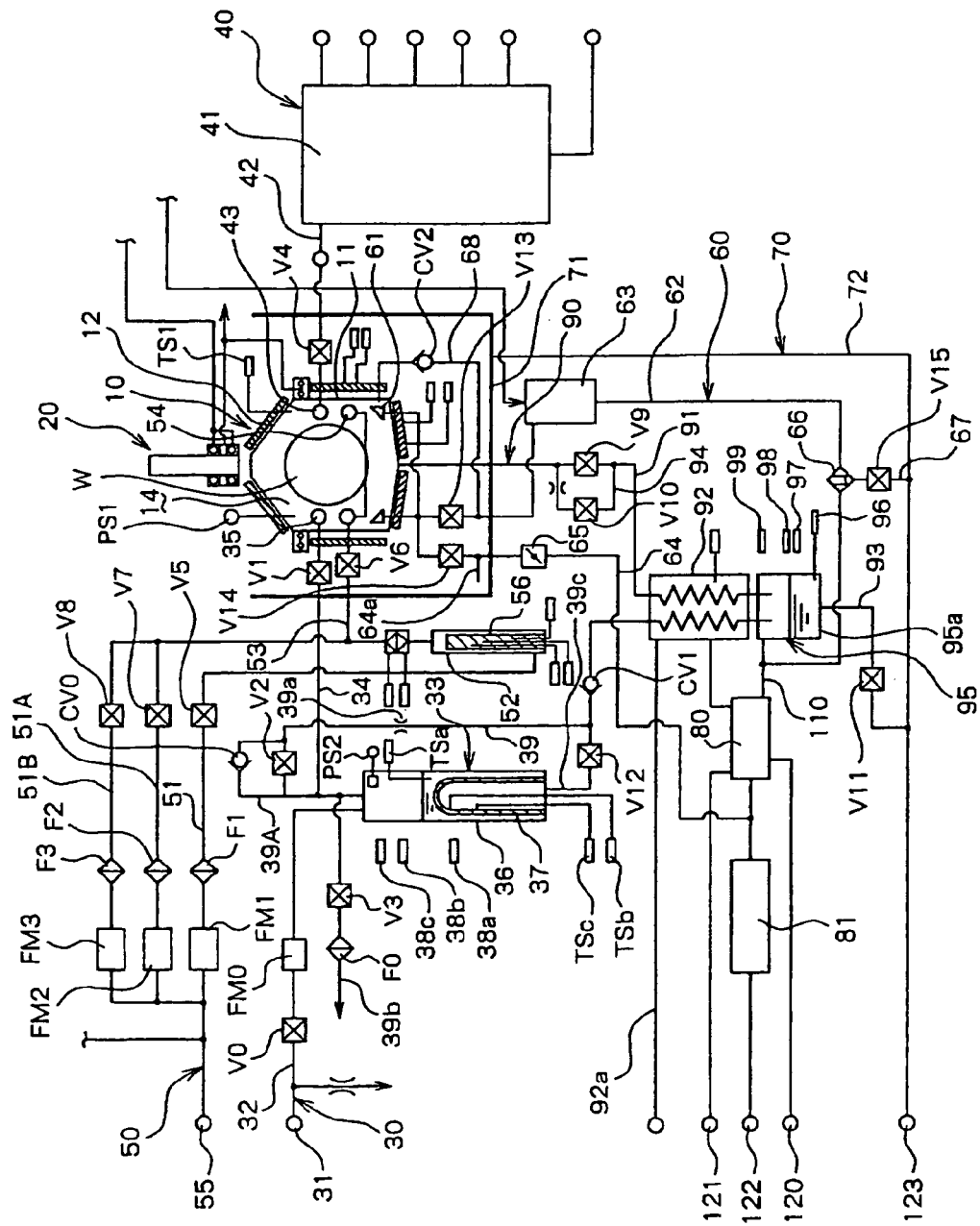
FIG. 1 is a schematic sectional view showing one example of a substrate processing apparatus of the present invention.
Figure 2A:
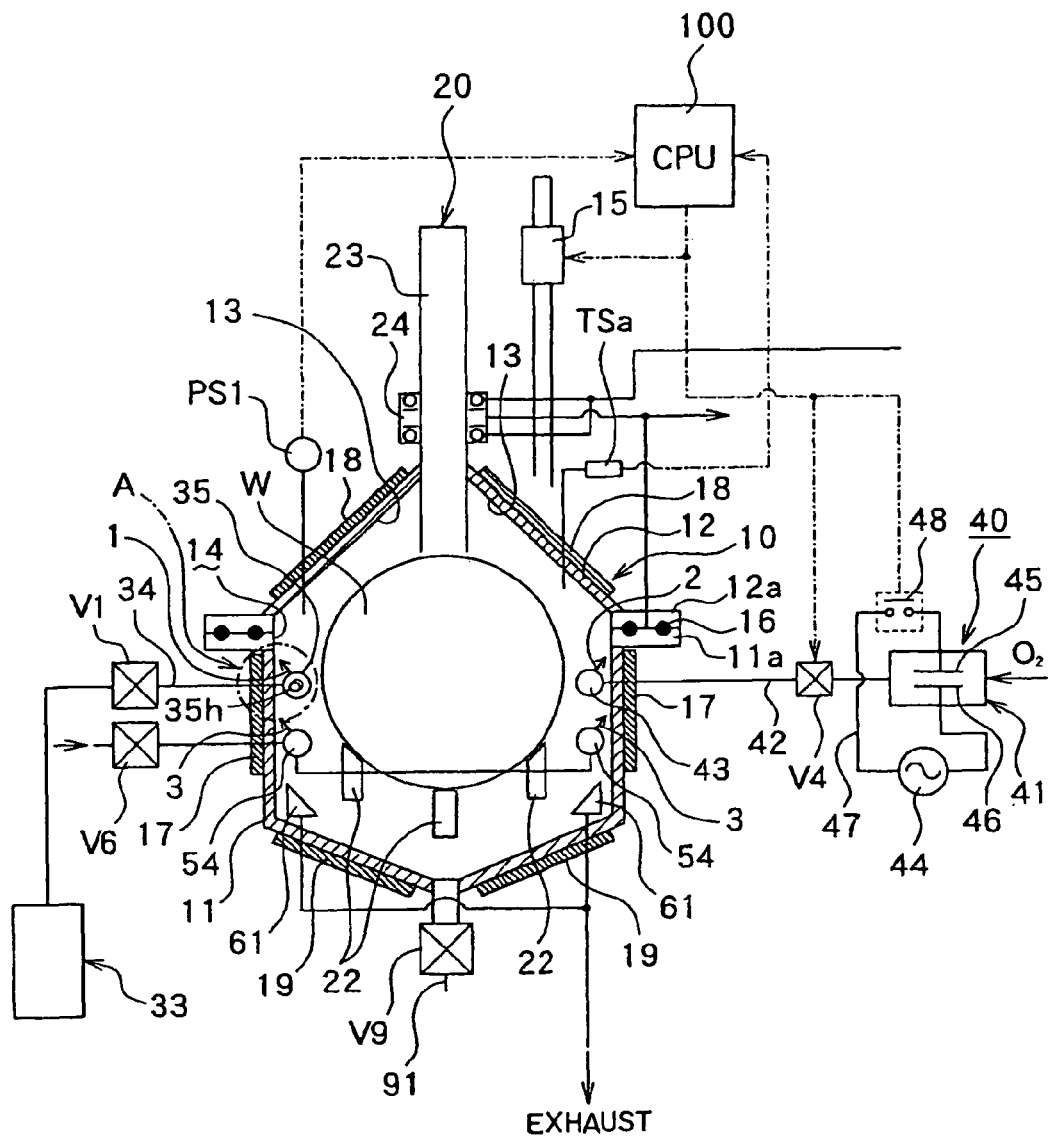
FIG. 2A is a sectional view showing an essential part of the substrate processing apparatus of FIG. 1.
Figure 2B:
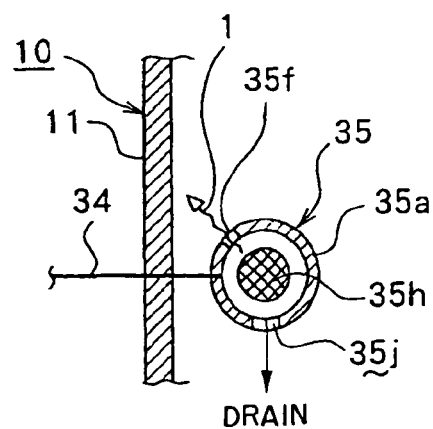
FIG. 2B is an enlarged sectional view of a part designated with letter A of FIG. 2A.
Figure 3:
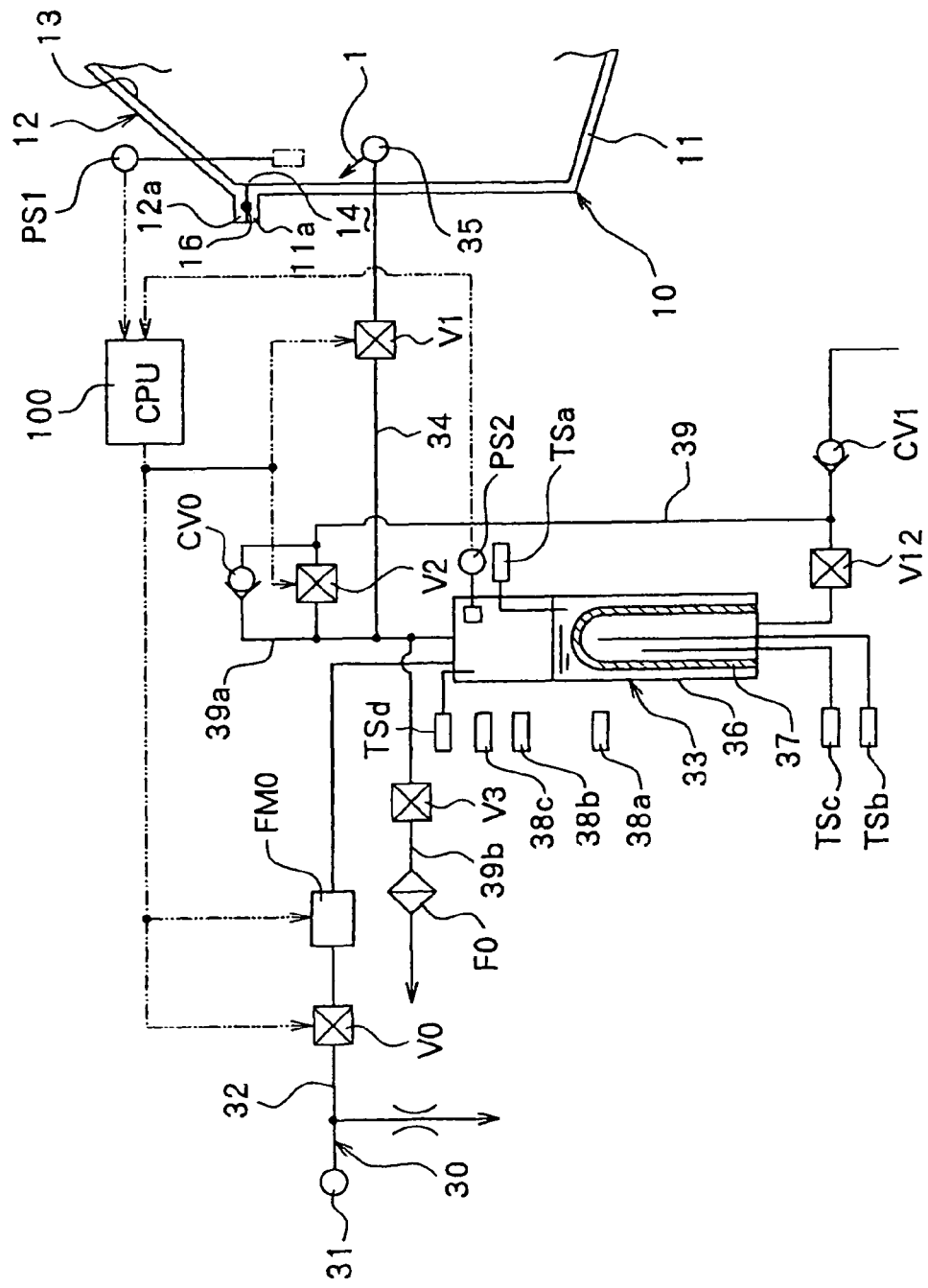
FIG. 3 is a schematic sectional view showing the first embodiment of a solvent-vapor generating means of the present invention.
Figure 4:
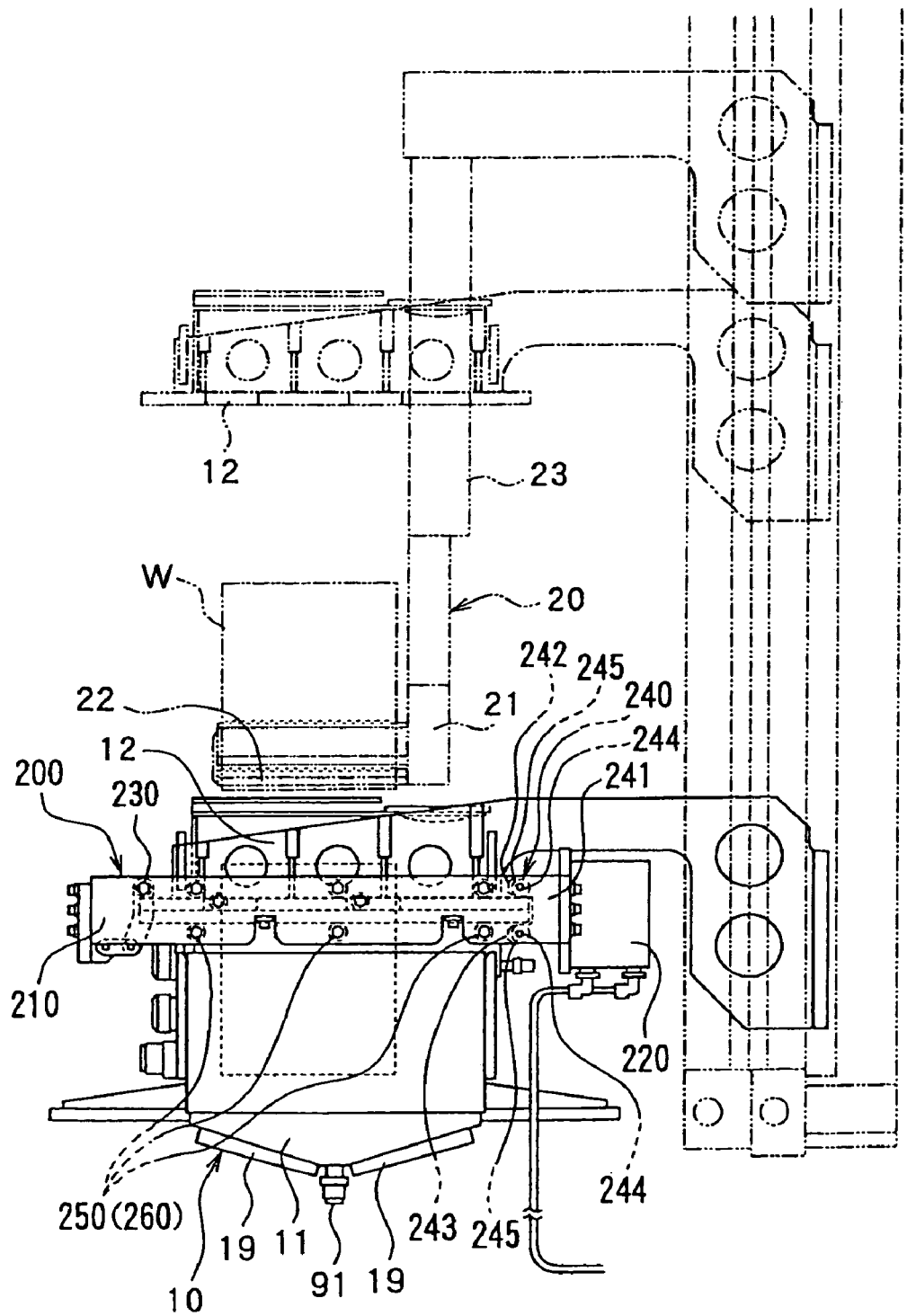
FIG. 4 is a view showing a processing container of this invention.
Figure 5:
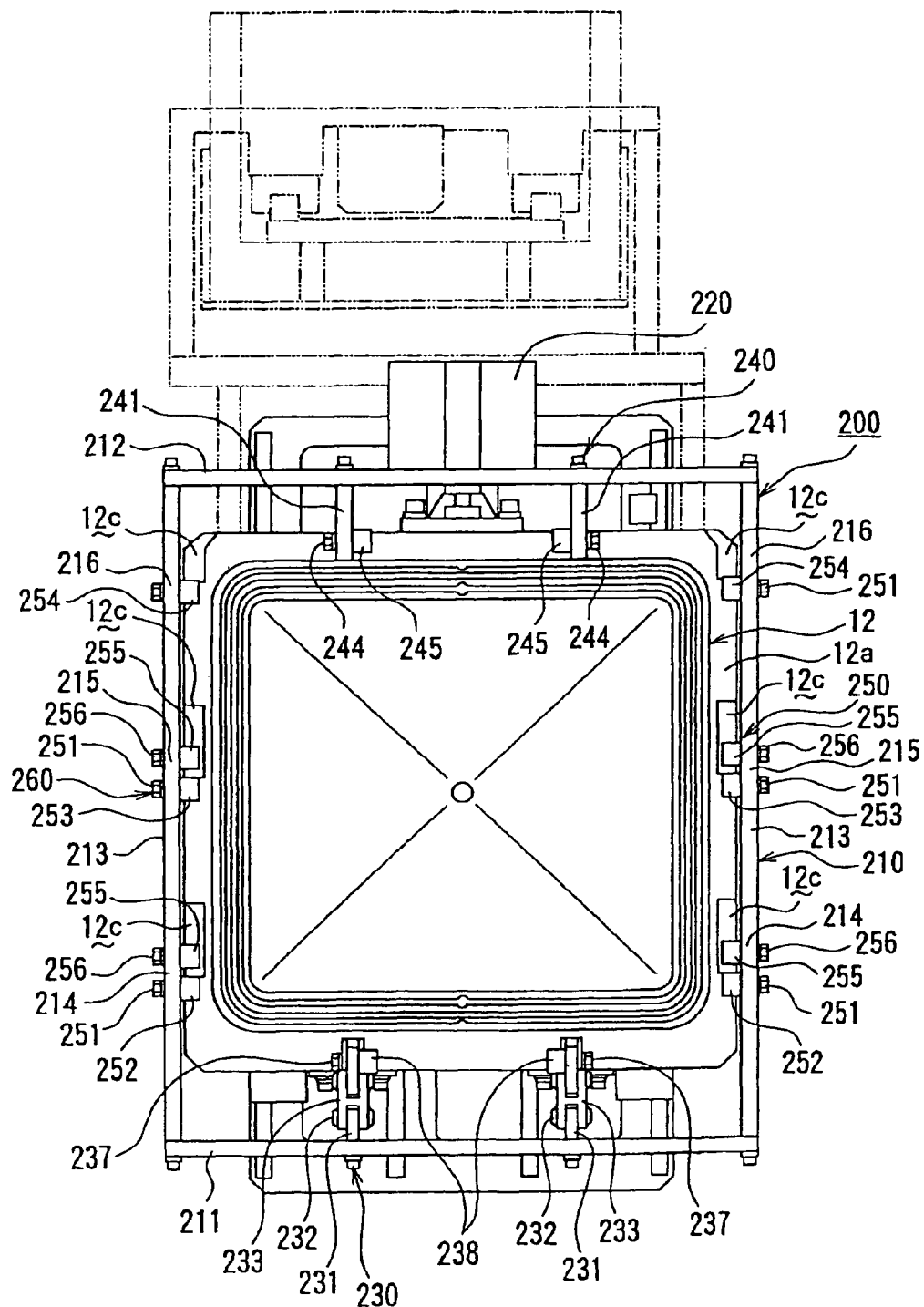
FIG. 5 is a schematic plan view showing a locking mechanism of the processing container of the invention.
Figure 6:
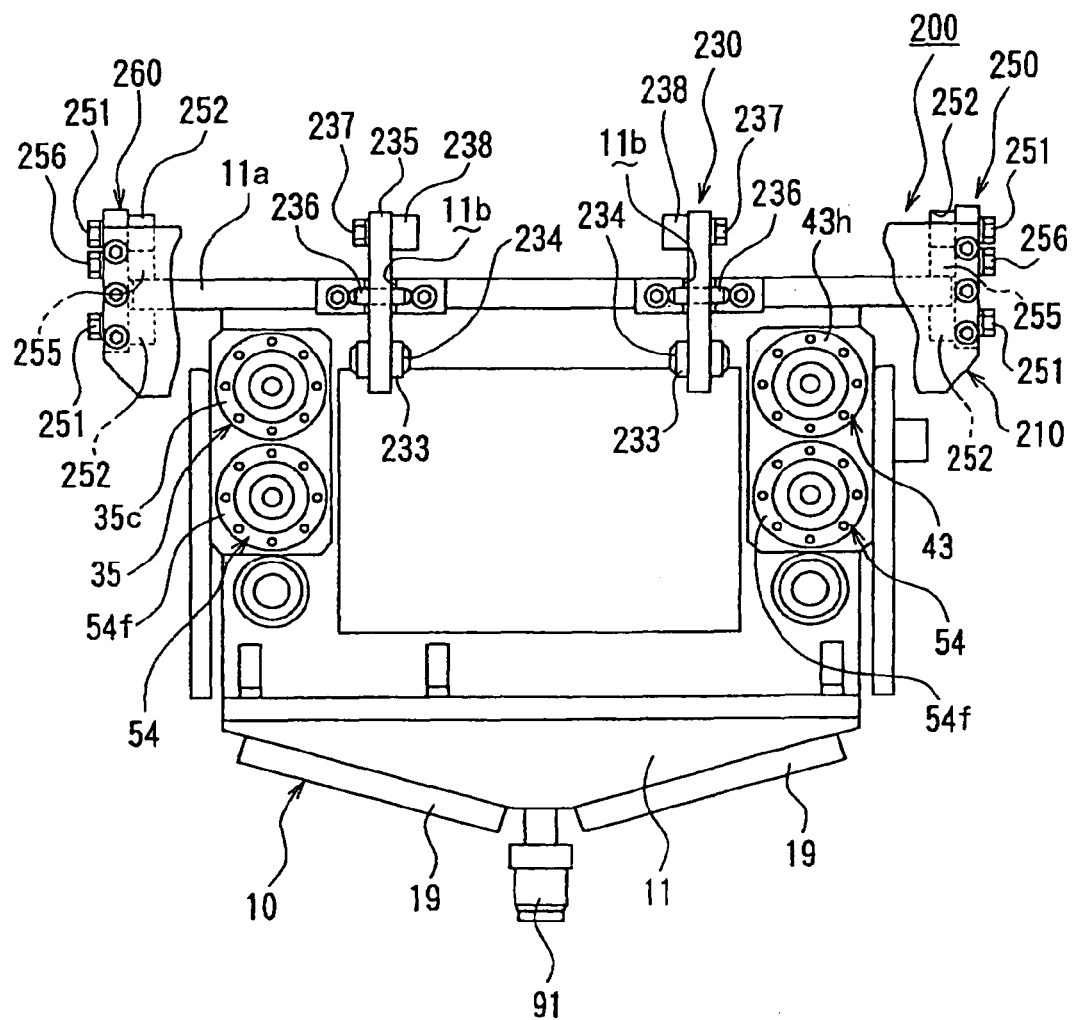
FIG. 6 is a side view showing the section of a part of the locking mechanism of FIG. 5.

FIG. 1 is a schematic sectional view showing one example of a substrate processing apparatus of the present invention. FIGS. 2A and 2B are sectional views showing essential parts of the substrate processing apparatus. FIG. 3 is a schematic sectional view showing the first embodiment of a solvent-vapor generator of the present invention. FIG. 4 is a schematic side view showing a processing container in accordance with the present invention.

The above substrate processing apparatus includes a processing container 10 in which the wafers W are processed, a wafer guide 20 (as substrate holder) for holding the wafers W in the processing container 10, a steam supplier 30 (as solvent-vapor supplier) for supplying the processing container 10 with steam 1 (as solvent vapor), an ozone-gas supplier 40 (as processing-gas supplier) for supplying the processing container 10 with ozone ($O_3$) gas 2 (as processing gas), an air supplier 50 for supplying the processing container 10 with air, interior exhausting means 60 for exhausting an atmosphere inside the processing container 10, circumferential-atmosphere discharging means 70 for exhausting an atmosphere around the processing container 10, an ozone killer 80 (as after-processing mechanism) for eliminating ozone in the interior atmosphere discharged from the processing container 10 and discharge means 90 for draining dewdrops in the processing container 10.

The processing container 10 is mainly formed by a container body 11 having a size allowing a plurality (e.g. fifty) of wafers W to be accommodated, a container cover 12 for opening or closing a loading/unloading port 14 formed on the top end of the container body 11 and a locking mechanism 200 for fastening the container body 11 to the container cover 12 into a sealed state.

The container cover 12 is formed so as to have a substantial reverse V-shaped section with downwardly-slanted faces 13 descending from the cover's center toward both sides of the container 10. Thus since the container cover 12 is provided, on its upside inner face, with the slanted faces 13 descending from the cover's center to both sides, it is possible to prevent condensed dewdrops of the steam 1 from adhering to the upside inner face of the container cover 12 and also possible to prevent the dewdrops of the steam 1 from falling and adhering to the wafers W.

Again, the container cover 12 is adapted so as to be movable up and down due to an elevating mechanism 15. The elevating mechanism 15 is connected to control means, for example, a central processing unit 100. The central processing unit 100 will be referred "CPU 100", hereinafter. On receipt of control signals from the CPU 100, the elevating mechanism 15 operates to open or close the container cover 12. When the container cover 12 rises, the loading/unloading port 14 is opened to allow the wafers W to be loaded into the container body 11. Subsequently to the loading of the wafers W into the container body 11, the descent of the container cover 12 allows the loading/unloading port 14 to be closed. In this case, a clearance between a flange 11a on the top end of the container body 11 and a flange 12a on the bottom end of the container cover 12 is sealed up with an expandable sealing member 16 to be inflated by injected air, while the closed condition of the container cover 12 is maintained by a locking mechanism 200. Thus, an enclosed atmosphere is formed in the processing container 10, establishing a condition that lets no gas leak outside.

As shown in FIGS. 5 to 8B, this locking mechanism 200 is equipped with a rectangular flame 210 arranged so as to surround the upper periphery of the container body 11 and an air cylinder 220 (as moving means) for moving the frame 210 in the horizontal direction. The frame 210 is provided, on respective sides thereof, with first to fourth engagement parts 230 to 260 which are engageable with the flange 11a of the container body 11 and the flange 12a of the container cover 12.

The first engagement part 230 is provided at two positions on both sides of a leading side 211 of the frame 210. Substantial H-shaped joint links 233 are attached to respective tips of attachment brackets 231 projecting from the frame 210 through joint pins 232, respectively. A swing link 235 has its lower end pivoted to the tip of each joint link 233 through a hinge pin 234. Through a pivot pin 236, the intermediate part of each swing link 235 is pivoted to both sides of an attachment groove 11b formed on the flange 11a of the container body 11, allowing the swing link 235 to swing in the vertical direction. Further, an engagement roller 238 is rotatably attached to one side of the top end of each swing link 235 through an attachment pin 237. Note, the flange 12a of the container cover 12 is provided, at the flange's part opposing the swing link 235, with a notch groove 12b allowing of insertion of the swing link 235. With the above-mentioned arrangement, when the drive of the air cylinder 220 causes the frame 210 to be moved toward the leading end, the swing links 235 are rotated (or inclined) to the side of the processing container 10 thereby to enter into the notch grooves 12b. Simultaneously, since the engagement rollers 238 press the top face of the flange 12a of the container cover 12, the tip side of the flange 12a of the cover 12 can be brought into close contact with the flange 11a of the container body 11.

The second engagement part 240 is provided at two positions on both sides of a base side 212 of the frame 210. At each position, a two-way bracket 241 is formed to project from the frame 210 and also provided with an upper projecting part 242 and a lower projecting part 243. Engagement rollers 245 are rotatably attached to respective lateral sides of the upper projecting part 242 and the lower projecting part 243 through joint pins 244, respectively (see FIGS. 8A and 8B). With the above-mentioned arrangement, when the drive of the air cylinder 220 causes the frame 210 to be moved toward the leading end, both of the engagement rollers 245 are respectively engaged with the upper face of the flange 12a of the container cover 12 and the lower face of the flange 11a of the container body 11, allowing both of the flanges 11a, 12a to be pinched between the rollers 245 closely. On respective inner sides of opposing sides 213 of the frame 210, at three positions each, the third engagement part 250 and the fourth engagement part 260 are respectively provided so as to be engageable with the upper face of the flange 12a of the container cover 12 and the lower face of the flange 11a of the container body 11. In this case, the third and fourth engagement parts 250, 260 each comprises three pairs (six pieces) of engagement rollers 252, 253, 254 which are rotatably attached to a leading part 214, an intermediate part 215 and an base part 216 of the side 213, at upper and lower positions for each part, through joint pins 251 respectively. Note, the flange 12a of the container cover 12 is provided, in a position where the frame 210 retreats, with notch grooves 12c for avoiding engagement of the flange 12a with the upper engagement rollers 252, 253, 254. In the vicinity (on the side of the base part 216) of the engagement rollers 252, 253 attached to the leading and intermediate parts 214, 215 respectively, there are provided guide rollers 255 which are positioned in the notch grooves 12c to engage with the upper face of the flange 11a of the container body 11. These guide rollers 255 are rotatably attached to the frame 210 through joint pins 256. With the above-mentioned arrangement, when the drive of the air cylinder 220 causes the frame 210 to be moved toward the leading end, the engagement rollers 252, 253, 254, which have been positioned above the notch grooves 12c before the movement of the frame 210, engage with the upper face of the flange 12a of the container cover 12 and the lower face of the flange 11a of the container body 11, at respective positions deviated from the notch grooves 12c. In this way, the engagement rollers 252, 253, 254 can pinch both of the flanges 11a, 12a closely.

Figure 7A:
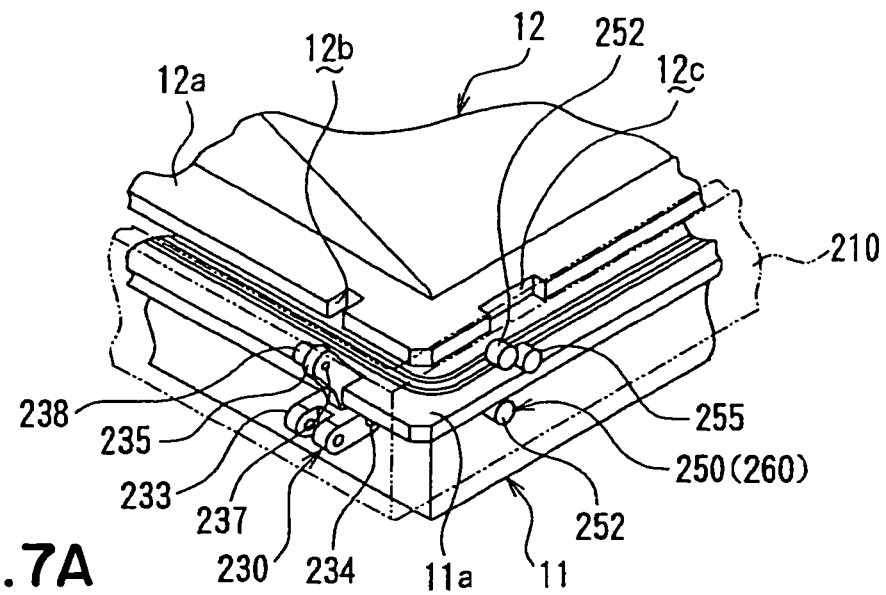
FIG. 7A is a perspective view of the locking mechanism of FIG. 5 showing its exploded condition.
Figure 7B:
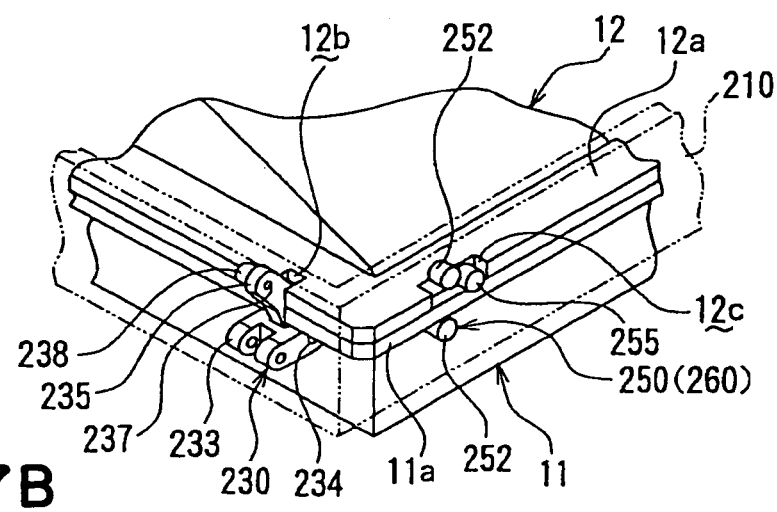
FIG. 7B is a perspective view of the locking mechanism of FIG. 5 showing its pre-locking condition.
Figure 7C:
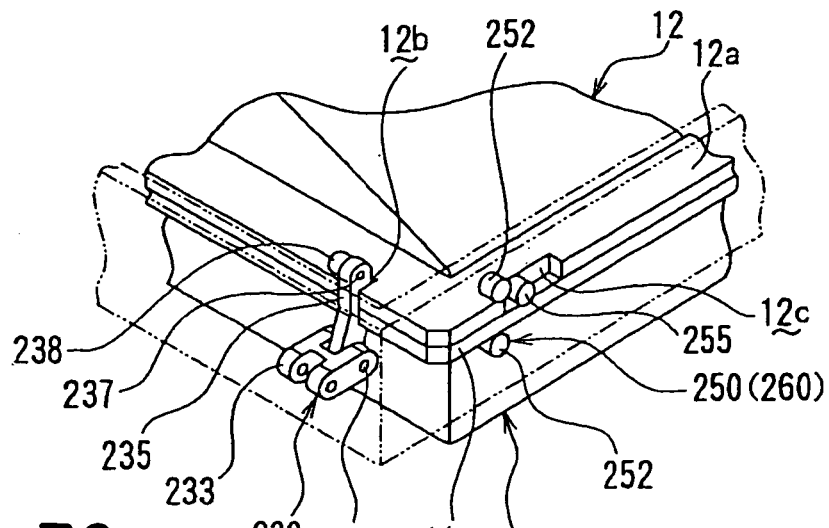
FIG. 7C is a schematic perspective view of the locking mechanism of FIG. 5 showing its locking condition.

Next, the operation of the locking mechanism 200 will be described with reference to FIGS. 4 to 8B. First, when the container cover 12 is positioned above the container body 11, as shown in FIG. 7A, the air cylinder 220 is contracted to position the flame 210 closer to the base end. Then, when the container cover 12 is lowered, the flange 12a of the container cover 12 abuts against the flange 11a of the container body 11 thereby to close up the opening of the container body 11 (see FIG. 7B). Subsequently to the closing of the container cover 12, when the air cylinder 220 is expanded so that the frame 210 moves closer to the leading end, then the swing links 235 of the first engagement part 230 rotate due to the rotation of the frame 210 and additionally, the engagement rollers 238 at the top ends of the swing links 235 engage with the upper face of the leading end of the flange 12a of the container cover 12 (see FIGS. 5 and 7C). Further, the upper and lower engagement rollers 245 of the second engagement part 240 engage with the upper face (on the side of the base end) of the flange 12a of the container cover 12 and the lower face (on the side of the base end) of the flange 11a of the container body 11 thereby to pinch both of the flanges 11a, 12a closely (see FIGS. 4 and 5). Similarly, in the third and fourth engagement parts 250, 260, the upper and lower engagement rollers 252, 253, 254 of three pairs (six pics.) engage with the upper faces on both sides of the flange 12a of the container cover 12 and the lower face on both sides of the flange 11a of the container body 11, respectively. Thus both of the flanges 11a, 12a are pinched by these rollers closely (see FIGS. 5 and 7C). In this state, the container cover 12 is locked up against the opening of the container body 11 closely.

Note, when it is required to cancel such a locked condition, the air cylinder 220 has only to be operated to its contracted side to move the frame 210 closer to the base end. That is, when the air cylinder 220 is operated to its contracted side to move the frame 210 closer to the base end, the swing links 235 of the first engagement part 230 rotate in the opposite direction to allow the engagement rollers 238 to be withdrawn from the upper face of the flange 12a of the container cover 12 (see FIG. 7B). Then, the upper and lower engagement rollers 245 of the second engagement part 240 withdraw from the upper face on the side of the base end of the flange 12a of the container cover 12 and also the lower face on the side of the base end of the flange 11a of the container body 11 (see FIG. 8B). Further, three pairs (six pics.) of upper and lower engagement rollers 252, 253, 254 of the third and fourth engagement parts 250, 260 move to the upside of the notch grooves 12c on both sides of the flange 12a of the container cover 12. Consequently, the container cover 12 becomes capable of opening and closing. Then, the container cover 12 is moved upward by the elevating mechanism 15 thereby to open the container body 11.

A rubber heater 17 is attached to the outer periphery of the container body 11. Similarly, rubber heaters 18, 19 are attached to the outer periphery of the container cover 12 and the bottom face of the container body 11, respectively. These rubber heaters 17, 18, 19 are connected to a not-shown power source. With the power supply from the source, these rubber heater 17, 18, 19 generate heat thereby to maintain an interior atmosphere of the processing container 10 at a designated temperature (e.g. a range from 80 to 120° C.). In detail, the temperature in the processing container 10 is monitored by a temperature sensor TS1. Then, the CPU 100 outputs control signals based on the above-monitored temperature to the rubber heaters 17, 18, 19. On receipt of the control signals, the heaters 17, 18, 19 generate heat, whereby the interior atmosphere of the processing container 10 can be heated to the designated temperature (e.g. a range from 80 to 120° C.). Additionally, owing to the provision of the heaters 17, 18, 19, it is possible to prevent the formation of dewdrops in the processing container 10. In connection, since the formation of dewdrops on the inner face of the container cover 12 is prevented by the rubber heater 18 outside the container cover 12, it is also possible to prevent an adhesion of dewdrops to the wafers W.

As shown in FIG. 4, the wafer guide 20 mainly comprises a guide part 21 and three holding members 33 secured to the guide part 21 horizontally and also paralleled with each other. Each holding member 33 has fifty grooves (not shown) formed at regular intervals to support respective lower margins of the wafers W. Therefore, the wafer guide 20 is capable of holding fifty wafers W (of two carriers) at regular intervals. Further, the wafer guide 20 is constructed so that a shaft 23 succeeding to the guide part 21 slidably penetrates through a through-hole (not shown) at the top of the container cover 12 and an expandable sealing member 24 to be inflated by injected air is interposed between the through-hole and the shaft 23 thereby to maintain the leak-tight state in the processing container 10.

The above steam supplier 30 mainly comprises a pure-water pipeline 32 connected to a pure-water source 31, a steam generator 33 forming the solvent-vapor generating means for vaporizing pure water supplied from the pipeline 32 thereby to produce the steam 1, a steam pipeline 34 for supplying the steam 1 in the steam generator 33 and a steam nozzle 35 for ejecting the steam 1 supplied from the pipeline 34 into the processing container 10.

One end of the pure-water pipeline 32 is connected with the pure-water source 31. A closing/opening valve V0 and a flow controller FM0 are interposed in the pure-water pipeline 32, in order from the side of the pure-water source 31. Note, in this specification, the following closing/opening valves including the closing/opening valve V0 will be referred "closing valve(s)" or simply "valve(s)", hereinafter. The closing valve V0 and the flow controller FM0 are controlled on a basis of control signals from the CPU 100 forming the control means. That is, whether to supply the pure water or not is determined by the opening/closing control on the closing valve V0, while the opening degree of the flow controller FM0 is controlled to adjust a flow rate of the pure water.

Figure 9A:
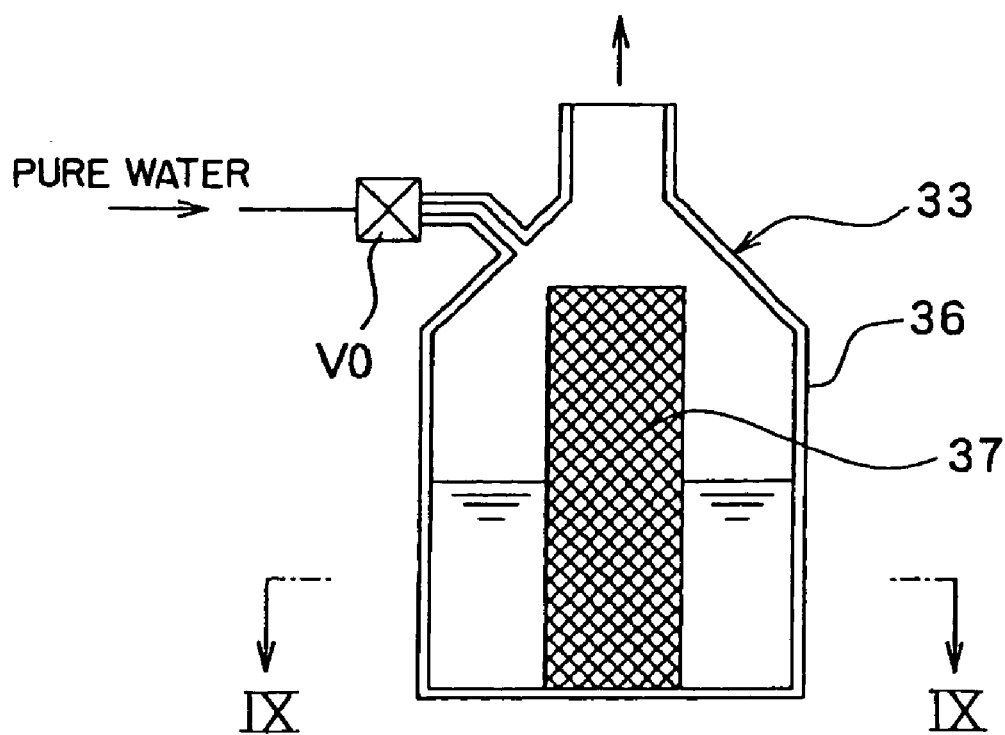
FIG. 9A is a schematic longitudinal sectional view showing one example of a heater of the solvent-vapor generating means of the invention.
Figure 9B:
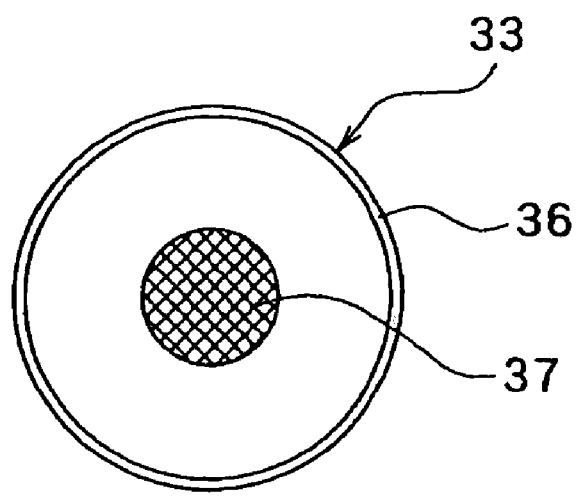
FIG. 9B is a sectional view taken along a line IX-IX of FIG. 9A.

As shown in FIGS. 3, 9A and 9B, the steam generator 33 includes a closed tank 36 as a container to be supplied with the pure water, a heater 37 disposed in the tank 37 at its center to extend in the depth-direction of the tank 37, in other words, vertically, a pressure sensor PS2 forming pressure detecting means for detecting a pressure of the steam in the tank 36, a supplement-start sensor 38a for detecting a level of the pure water in the tank 36, a supplement-end sensor 38b and an upper limit sensor 38c. In the steam generator 33 constructed above, the pure water supplied into the tank 36 is heated in adjustment depending on a quantity of pure water, thereby producing a predetermined quantity of steam. That is, the pure water is vaporized by heat of the heater 37 corresponding to a contact area between the pure water supplied into the tank 36 and the heater 37, whereby a production (generation) amount of the steam 1 can be adjusted.

In this arrangement, the sensors 38a to 38c are connected to the CPU 100. When a level of the pure water in the tank 36 is detected by the supplement-start sensor 38a, then the detection signal is transmitted to the CPU 100. Then, on receipt of a control signal from the CPU 100, the closing valve V0 opens to supplement the tank 36 with the pure water. On the other hand, when the level of the pure water in the tank 36 is detected by the supplement-end sensor 38b, the detection signal is transmitted to the CPU 100. Then, on receipt of the control signal from the CPU 100, the closing valve V0 closes to stop the supplement of pure water into the tank 36. In this way, a designated amount of pure water is always stored in the tank 36. Note, the upper limit sensor 38c serves to detect an abnormal situation where the tank 36 is filled up with the pure water. At the abnormality, on the ground of the detection signal from the upper limit sensor 38c, a control signal is transmitted from the CPU 100 to e.g. an alarm unit (not shown). In the tank 36, there are arranged a first temperature sensor TSa for detecting a temperature of water as a liquid solvent, a second temperature sensor TSb for regulating a temperature of the heater 37, a third temperature sensor TSc for detecting an excessive temperature of the heater 37 thereby to prevent it from overheating and a fourth temperature sensor Tsd for detecting a temperature of the steam as a gaseous solvent. These temperature sensors TSa to TSd are all connected to the CPU 100. The second temperature sensor TSb is adapted so as to monitor a quantity of steam on generation, while the first and third temperature sensors TSa, TSc are adapted so as to monitor a pressure of the steam, as described later.

In the steam generator 33, the pressure of the steam on generation is detected by a pressure sensor PS2 (as pressure detector). Then, the detection signal is transmitted from the sensor PS2 to the CPU 100. This pressure detected by the pressure sensor PS2 allows a boiling condition of the pure water to be detected. It is noted that the higher a pressure is elevated, the more a quantity of the steam 1 gets. Therefore, it is desirable to maximize a calorific capacity of the heater 37 of the steam generator 33 in view of allowing the steam 1 of a designated quantity to be supplied smoothly. A first closing valve V1 (as the first closing means) is interposed in the steam pipeline 34 connecting the steam generator 33 with the steam nozzle 35. On the upstream side (on the side closer to the tank 36) of the first closing valve V1, the steam pipeline 34 branches out into an exhaust pipeline 39 which is connected to a later-mentioned mist trap 95. A second closing valve V2 (as the second closing means) is interposed in the exhaust pipeline 39. Connected to both upstream and downstream sides of the second closing valve V2 is a by-pass pipeline 39A in which a pressure-release valve (safety valve) CV0 is interposed so that a pressure in the steam generator 33 does not get higher than a predetermined value. For example, this predetermined value is established smaller than a proof pressure of the tank 36 or each proof pressure limit of the closing valves V1, V2, V3. Connected with the upstream side of the first and second closing valves V1, V2 is an atmosphere communication pipeline 39b which communicates with the atmosphere through a closing valve V3 and also a filter F0, providing an air intake at the time of draining the water in the steam generator 33. Note, the exhaust pipeline 39 is constructed so as to discharge the steam 1, which has passed through the pressure release valve CV0, and the steam 1, which has passed through the closing valve V2 when the second closing valve V2 is opened or closed to maintain a "hot-air" pressure of the steam generator 33 in a predetermined range, into the mist trap 95 together. The first and second closing valves V1, V2 are respectively connected to the CPU 100. Therefore, the closing/opening operations of the valves V1, V2 are controlled on the ground of control signals from the CPU 100. In this embodiment, the opening/closing operations of the first and second closing valves V1, V2 are controlled corresponding to a minimum value (threshold value) of the steam 1 to be supplied into the processing container 10. Additionally, the CPU 100 is also connected to a pressure sensor PS1 (as container-pressure detector) arranged in the processing container 10. Thus, upon comparing a pressure in the processing container 10 detected by the pressure sensor PS1 with a pressure of the steam generated by the steam generator 23, the first and second closing valves V1, V2 are controlled in their opening/closing operations. With this structure, it is possible to supply the processing container 10 with the steam 1 of pressure equal to or more than the pressure in the processing container 10. Note, if only allowing the CPU 100 to store data of pressure in the processing container 10 at processing in advance, then it is possible to control the opening/closing operations of the first and second closing valves V1, V2 by comparing the data with a pressure of the steam generated in the steam generator 33.

Figure 10A:
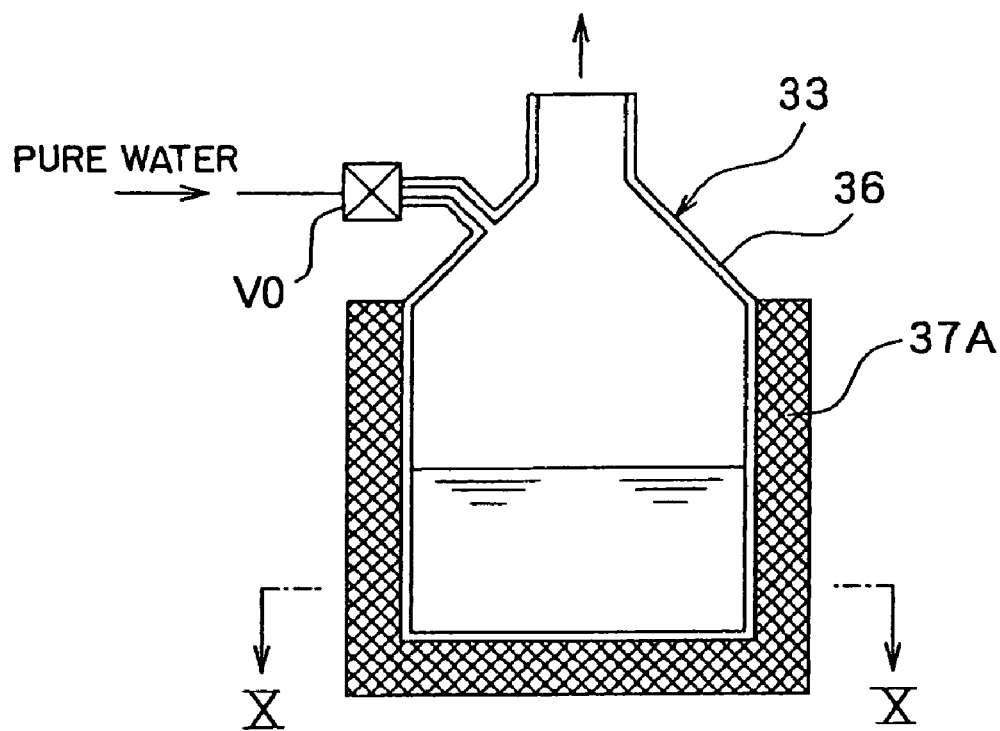
FIG. 10A is a schematic longitudinal sectional view showing another example of the heater of the solvent-vapor generating means of the invention.
Figure 10B:
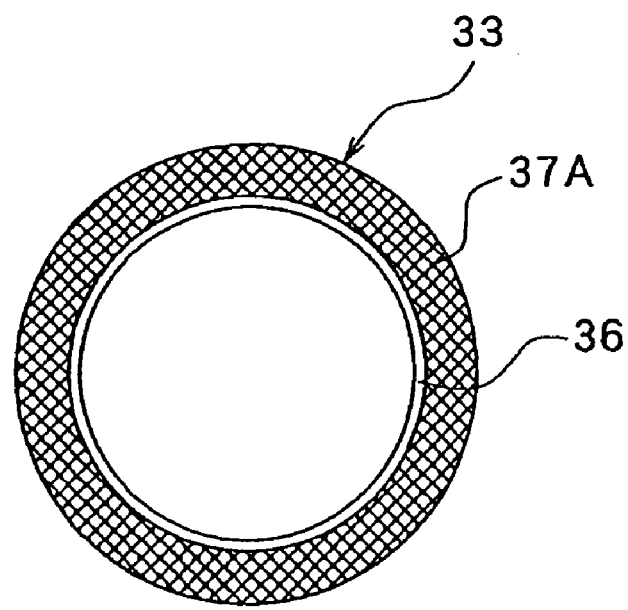
FIG. 10B is a sectional view taken along a line X-X of FIG. 10A.
Figure 11A:
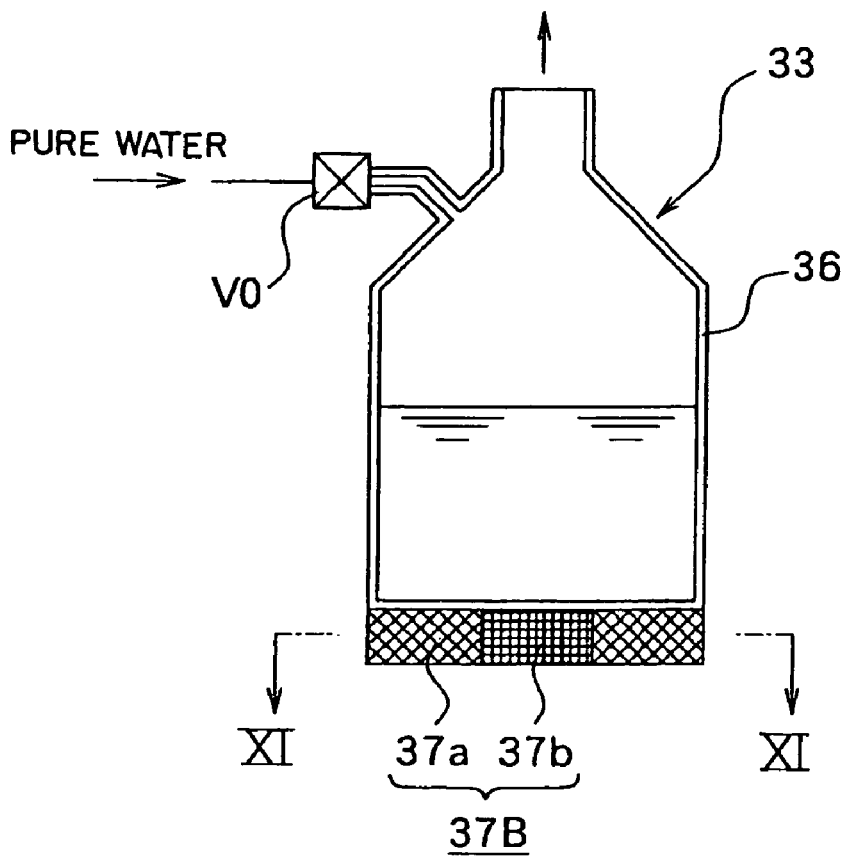
FIG. 11A is a schematic longitudinal sectional view showing the further example of the heater of the solvent-vapor generating means of the invention.
Figure 11B:
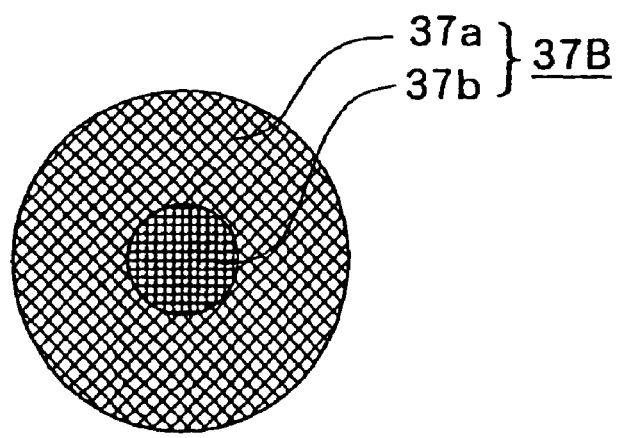
FIG. 11B is a sectional view taken along a line XI-XI of FIG. 11A.

The above description is related to the arrangement where the heater 37 is arranged in the tank 36 at its central part in the depth-direction of the tank 36, i.e. vertically. Nevertheless, the heater 37 may be arranged optionally. For example, as shown in FIGS. 10A and 10B, the tank 36 may be provided, on its peripheral side and bottom faces thereof, with an outside heater 37A. In this case of providing the outside heater 37A, the quantity of the steam on generation (production) can be adjusted by a quantity of pure water accommodated in the tank 36. Alternatively, as shown in FIGS. 11A and 11B, the tank 36 may be provided, on its bottom face, with a separate heater 37B consisting of a doughnut-shaped heater 37a and a circular heater 37b surrounded by the heater 37a, both of which are capable of operating independently of each other, thereby to form a heating part for pure water. According to the separate heater 37B, the steam 1 can be produced by heating the pure water while switching an operation between the doughnut-shaped heater 37a and the circular heater 37b. Alternatively, the pure water can be also heated by operating both of the heaters 37a, 37b, thereby producing the steam 1. Accordingly, providing that the calorific capacity of the doughnut-shaped heater 37a is represented by Qa and the calorific capacity of the circular heater 37b is represented by Qb (Qb<Qa), it is possible to heat the pure water in accordance with three kinds of heating patterns of Qa, Qb and Qa+Qb (Qa<Qb<Qa+Qb) to produce the steam 1. Note, the separate heater 37B does not always have to be formed by the doughnut-shaped heater 37a and the circular heater 37b. In this view, the heater 37B may be formed by two or more heaters optionally.

As shown in FIGS. 12A and 12B, the steam nozzle 35 includes a pipe-shaped nozzle body 35a into which a heater 35h forming the heating body is inserted through spacers 35i. The nozzle body 35a is also provided, on one end thereof, with a female screw part 35b for connection with the steam pipeline 34, and an attachment flange 35c. While, a fitting groove 35e for engagement with an O-ring 35d is formed on the circumference of the leading end of the nozzle body 35a. On one side face of the nozzle body 35a, a great number of steam ejection orifices 35f (nozzle orifices) are formed at appropriate intervals. On the other side face of the nozzle body 35a, three drain ports 35j are formed at appropriate intervals. In assembly, the leading end of the steam nozzle 35 is closed up with a cap 35g through the O-ring 35d, while the flange 35c of the nozzle 35 is fixed to the container body 11 of the processing container 10 through attachment screws, so that the nozzle 35 is arranged in the processing container 10 horizontally. Then, the steam ejection orifices 35f are established so as to direct at a predetermined angle to the inner wall of the processing container 10. For example, the steam ejection orifices 35f are arranged in respective positions each at an angle of approx. 45 degrees against a vertical upward direction as the center point. The reason why the steam ejection orifices 35f are directed to the inner wall of the processing container 10 is to prevent the occurrence of droplets on the wafers W, which would be caused by the steam being sprayed to the wafers W directly. Additionally, since the nozzle orifices 35f are directed to the inner wall of the processing container 10 obliquely upward, the steam rises along the inner wall and is mixed, at the top part of the container 10, with an ozone gas ejected from a later-mentioned ozone-gas nozzle 45. Thereafter, the resultant mixture gas is supplied to the wafers W, with a downward air stream.

As mentioned above, since the heater 35h is inserted into the nozzle body 35a and the inside space of the body 35a is heated by the so-inserted heater 35h, it is possible to prevent the steam from forming dewdrops in the nozzle body 35a and also possible to exclude a possibility that the dewdrops scatter to stick to the wafers W at the time of emitting the steam. Therefore, it is possible to restrict an generation of bacteria due to the occurrence of dewdrops in the nozzle body and also possible to prevent an occurrence of particles by the dewdrops scattering around at the time of ejecting the steam.

Additionally, since the arrangement where the steam ejection orifices 35f of the steam nozzle 35 open against the inner wall of the processing container 10 enables the steam to avoid its direct contact with the wafers W, it is possible to restrict the occurrence of particles and attain the uniformity in the cleaning (etching) process. Further, as the nozzle body 35a is provided, on its bottom, with the drain ports 35j for dewdrops, it is possible to discharge the dewdrops stored in the nozzle body 35a outside the body 35a rapidly. Moreover, it is possible to prevent the dewdrops from being scattered around at the time of ejecting the steam.

Note, in the above-mentioned steam nozzle, the heater 35h may be covered with fluororesin coating. Then, it becomes possible to prevent metallic components (e.g. stainless) of the heater from dissolving into the steam.

On the other hand, the ozone-gas supplier 40 is mainly formed by an ozone-gas generator 41, an ozone-gas pipeline 42 for supplying the ozone gas 2 from the generator 41 and an ozone-gas nozzle 43 for ejecting the ozone gas 2 from the pipeline 42 into the processing container 10.

In this embodiment, as shown in FIG. 2A, the ozone-gas generator 41 is capable of producing ozone ($O_3$) by allowing oxygen ($O_2$) forming the base gas as material to pass between discharge electrodes 45, 46 connected with a high-frequency source 44 for application of high-frequency voltage. A switch 48 is interposed in an electric circuit 47 connecting the high-frequency source 44 with the discharge electrodes 45, 46. The switch 48 is controlled by control signals from the CPU 100. That is, the switch 48 is controlled as to or not to produce the ozone. The ozone-gas pipeline 42 includes a closing valve V4 arranged on the side of the ozone-gas generator 41. This closing valve V4 is controlled by control signals from the CPU 100 forming the controller. That is, the closing valve V4 is controlled to open or close on the basis of flowing the ozone gas or not. As shown in FIGS. 13 and 14, the above ozone-gas nozzle 43 mainly comprises an outer pipe 43b having a number of ozone ejecting orifices 43a formed on its side face at appropriate intervals, and an inner pipe 43d inserted into the outer pipe 43b through a clearance. The inner pipe 43d has a plurality of (e.g. three) communication ports 43c formed on its side face at appropriate intervals. Again, the inner pipe 43d is provided with an ozone-gas passage 43e of which one end is opened and another end is closed and which communicates with the communication ports 43c. The one end of the inner pipe 43d projects outside the outer pipe 43b and is provided with a female screw part 43g for connection with the ozone-gas pipeline 42, and an attachment flange 43h. On the other end of the inner pipe 43d, a closing plate 43i is fitted to close the clearance between the outer pipe 43b and the inner pipe 43d.

While the above-constructed inner pipe 43d is inserted into and fixed to the outer pipe 43b so that the communication ports 43c are on the opposite side of the ozone ejecting orifices 43a, the attachment flange 43h of the inner pipe 43d is fixed to the container body 11 of the processing container 10 through not-shown attachment screws. Consequently, the inner pipe 43d is arranged horizontally in the processing container 10 while the ozone ejecting orifices 43a are established in respective positions each making a predetermined inclination angle, for example, approx. 45 degrees toward the inner wall of the processing container 10.

The reason why the communication ports 43c are on the opposite side of the ozone ejecting orifices 43a is as follows. That is, owing to this arrangement, the ozone gas from the ozone-gas generator 41 flows from the ozone-gas passage 43e to a clearance 43j defined between the outer pipe 43b and the inner pipe 43d, through the communication ports 43c. After detouring around the clearance 43j, the ozone gas is ejected into the processing container 10 through the ozone ejecting orifices 43a. In this way, the uniform ejection of ozone gas can be ensured.

Further, the reason why the ozone ejecting orifices 43a are positioned while each making a predetermined inclination angle, for example, approx. 45 degrees toward the inner wall of the processing container 10, is to prevent the ozone gas from being blown to respective surfaces of the wafers W directly.

An air supplier 50 includes a first air pipeline 51 for supplying air, a hot-air generator 51 for heating air from the first air pipeline 51 thereby to produce a hot air 3, a second air pipeline 53 for supplying the hot air 3 in the hot-air generator 52 and air nozzles 54 for ejecting the hot air 3 supplied from the second air pipeline 53. The air supplier 50 has a purge-air pipeline 51A and an air pipeline 51B used in operating an ejector 63 for purging, both of which are connected to both of the first air pipeline 51 and the second air pipeline 53 and further arranged in parallel with each other.

In this arrangement, the first air pipeline 51 has its one end connected with an air source 55. Further, in the first air pipeline 51, there are interposed a flow controller FM1, a filter F1 and a closing valve V5 in order from the air source 55. The closing valve V5 and the flow controller FM1 are connected to the CPU 100 forming the controller, thereby allowing both air supply and its flow rate to be controlled on the basis of the control signals from the CPU 100. The hot-air generator 52 is provided, inside thereof, with a heater 56 for heating the air. The second air pipeline 53 has a closing valve V6 interposed therein. Similarly, the closing valve V6 is controlled by the CPU 100 forming the controller.

In the air pipeline 51A for purging and the air pipeline 51B for ejector-purging, there are interposed flow controllers FM2, FM3, filters F2, F3 and closing valves V7, V8 in order from the air source 55, respectively. The closing valves V7, V8 and the flow controllers FM2, FM3 are connected to the CPU 100 forming the controller, thereby allowing both respective air supply and respective flow rates to be controlled on the basis of the control signals from the CPU 100. Note, when the ejector 63 is operated to purge the processing container 10, then the air pipeline 51B for ejector-purging supplies air having a flow rate that is normally determined by the ejector 63 itself. If the flow rate of cooled air flowing through the air pipeline 51A coincides with the flow rate of the ejector 63, there is no need to provide the air pipeline 51B.

Figure 15:
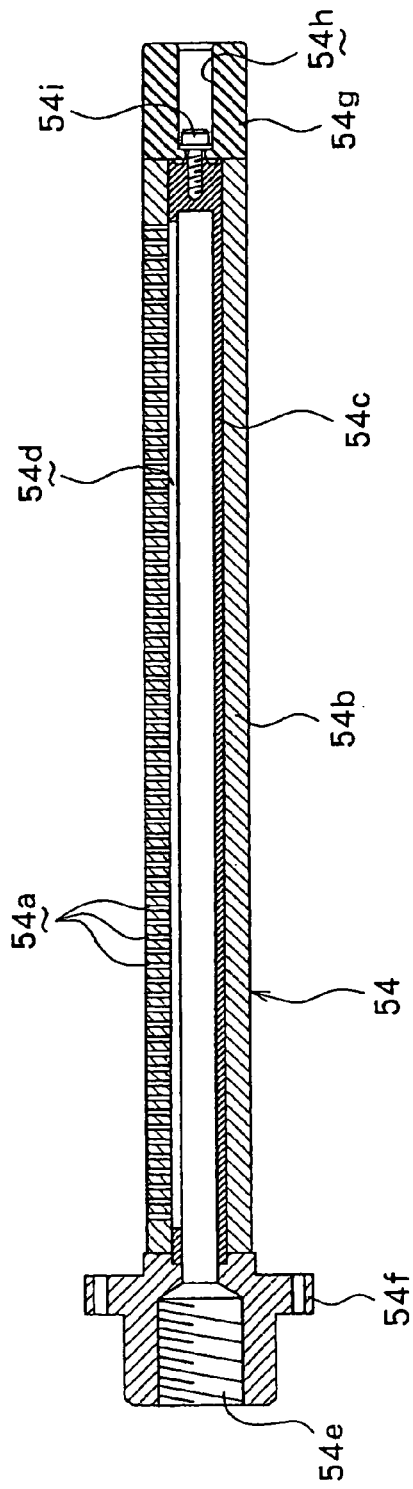
FIG. 15 is a sectional view of an air nozzle of the invention.
Figure 16:
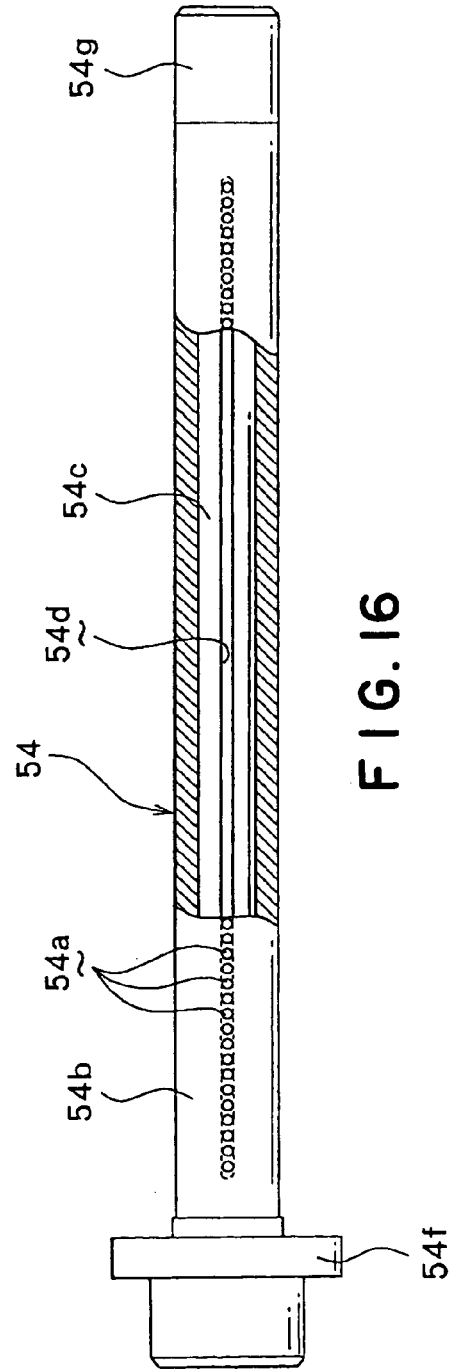
FIG. 16 is a plan view of a part of the air nozzle of FIG. 15, showing its section.

As shown in FIGS. 15 and 16, one air nozzle 54 is equipped with an outer pipe 54b which is provided, on its one side, with a plurality of air ejecting orifices 54a at appropriate intervals, and an inner pipe 54c inserted into the outer pipe 54b through a clearance. The inner pipe 54c is also provided, on its one side facing the air ejecting orifices 54a of the outer pipe 54b, with a slit hole 54d. The inner pipe 54c is formed so that its one end projects outside the outer pipe 54d. On the side of this projecting end, the inner pipe 54c has a female screw part 54e formed for connection with the second air pipeline 53, and also an attachment flange 54f. The other end of the inner pipe 54c is connected, through a connecting screw 54i, to a fixing member 54g which is to be secured to the side wall of the container body 11 of the processing container 10.

In the so-constructed air nozzles 54, the respective attachment flanges 54f are fixed to the container body 11 of the processing container 10 through not-shown attachment screws. Further, with an adjustment of the connecting screws 54i, the air nozzles 54 are arranged on both sides (below the wafers W) of the processing container 10 horizontally on condition that the air ejecting orifices 54a are established in respective positions each making a predetermined inclination angle, for example, approx. 45 degrees toward the inner wall of the processing container 10. Note, the reason why the air ejecting orifices 54a are positioned while each making a predetermined inclination angle, for example, approx. 45 degrees toward the inner wall of the processing container 10, is to prevent the air from being blown to respective surfaces of the wafers W directly.

The discharge means 90 includes a first exhaust pipeline 91 connected to the bottom of the processing container 10, a mist trap 95 consisting of a cooling part 92 connected to the first exhaust pipeline 91 and a reserving part 95a connected to the downstream side of the cooling part 92, and a second drain pipeline 93 connected to the bottom of the reserving part 95a. A closing valve V9 is interposed in the exhaust pipeline 91, while a supplement valve V10 is interposed in a by-pass pipeline 94 for connecting both upstream and downstream sides of the valve V9 with each other. The valve V10 performs its opening/closing operation in opposition to that of the closing valve V9. Further, the second drain pipeline 93 has a closing valve V11 interposed therein. Note, as there is a possibility that the ozone remains in the liquid, the second drain pipeline 93 is communicated with a factory acid-drain system 123.

The mist trap 95 is equipped with an empty-detecting sensor 96, a drain-start sensor 97, a drain-end sensor 98 and an overflow-detecting sensor 99 in order from the bottom. The valves V9, V10, V11 and the sensors 96, 97, 98, 99 are connected with the CPU 100 as the controller though their connections are not shown. In this way, the closing/opening operations of the closing valves V9, V10, V11 are controlled on the basis of control signals from the CPU 100. In detail, at processing, the valve V9 is closed, while the valve V10 is opened to discharge small quantities of ozone gas and steam from the processing container 10 for adjustment of its interior pressure. After processing, the valve V10 is closed, while the valve V9 is opened to exhaust the processing container 10. When the dewdrops are collected to a certain level so that the drain-start sensor 97 can detect it, a detection signal of the sensor 97 is transmitted to the CPU 100 to output a control signal. Then, the control signal of the CPU 100 allows the valve V11 to open for a start of the drain operation. With a progress of the drain operation, when the drain-end sensor 98 detects a liquid level, a detection signal of the sensor 98 is transmitted to the CPU 100 to output a control signal. Then, the control signal of the CPU 100 allows the valve V11 to close for a standstill of the drain operation. When the liquid level is raised to reach a level of the overflow-detecting sensor 99, a warning signal is transmitted from the sensor 99 to the CPU 100. On the other hand, when the liquid level is lower than a level of the empty-detecting sensor 96, a prohibit signal is transmitted from the empty-detecting sensor 96 to the CPU 100. Then, the control signal of the CPU 100 allows the valve V11 to close. Owing to the provision of the empty-detecting sensor 96, it is possible to prevent the occurrence of a situation where all the dewdrops are carried away so as to empty the mist trap 95 thereby to cause the ozone gas 2 to be leaked out to the factory acid-drain system.

The upper part of the mist trap 95 is connected to an exhaust pipeline 110 in which the ozone killer 80 and an exhaust manifold 81 are interposed successively.

The mist trap 95 is formed so as to separate gas and liquid for discharge. In detail, the steam 1 and the ozone gas 2 discharged from the processing container 10 through the first exhaust pipeline 91 flow into the mist trap 95 through the cooling part 92. In this arrangement, since the cooling part 92 is supplied with cooled water via a cooled-water pipeline 92a, the steam 1 discharged from the processing container 10 is cooled down into condensation while passing through the cooling part 92. Then, the dewdrops resulting from the condensation of the steam 1 fall in the mist trap 95. On the other hand, the ozone gas 2 is directly introduced into the mist trap 95. In this way, the inside atmosphere discharged from the processing container 10 are separated into the ozone gas 2 and the dewdrops and subsequently, the ozone gas 2 is discharged into the exhaust pipeline 110, while the dewdrops are drained for the second drain pipeline 93. The steam 1 and pure water discharged from the steam generator 33 are introduced into the mist trap 95 through an exhaust pipeline 39c which includes a closing valve V12 and is connected to the exhaust pipeline 39, and also the exhaust pipeline 39 including a check valve CV1. The pure water flows through the exhaust pipeline 39 and falls into the mist trap 95. The steam 1 is cooled down into condensation while passing through the cooling part 92, so that the resultant dewdrops fall into the mist trap 95. Note, the closing valve V12 is connected to the CPU 100 as the controller, allowing the closing/opening operation to be controlled by control signals from the CPU 100.

When heated, the ozone killer 80 is capable of thermal decomposition of ozone into oxygen. The temperature for heating the ozone killer 80 is established to be more than e.g. 400° C. Note, it is desirable that the ozone killer 80 is electrically connected to an interruption-less power source (not shown) in the factory, in view of allowing a power supply on the killer 80 to be stably ensured at even interruption of service. Then, even if the interruption of service arises, the operation of the ozone killer 80 is maintained to eliminate ozone, thereby ensuring the safety in the factory. It should be noted that the ozone killer 80 forms an exhaust resistance because gas abruptly expands in the ozone killer 80 and additionally, a built-in exhaust pipeline is formed in spiral.

The ozone killer 80 is provided with a temperature sensor (not shown) which forms an operation detector for detecting the operation of the killer 80. This temperature sensor is adapted so as to detect a temperature of the heated ozone killer 80. Further, the temperature sensor is connected to the CPU 100 forming the controller. In operation, the detecting signal is transmitted from the temperature sensor to the CPU 100. Then, on receipt of the detecting signal from the temperature sensor, the CPU 100 judges whether the ozone killer 80 is ready to eliminate the ozone sufficiently. Hot air resulting from the thermal decomposition in the ozone killer 80 is discharged through a hot-air exhaust system 120 in the factory. Similarly, the liquid as the result of thermal decomposition in the ozone killer 80 is discharged outside the factory through its exclusive drain (cooling-water out) system 121.

The exhaust manifold 81 is formed so as to accomplish the exhausting operation for the whole apparatus collectively. In the exhaust manifold 81, there are arranged a plurality of pipes (not shown) for taking in an atmosphere behind the processing apparatus, thereby preventing the ozone gas 2 from being diffused from the processing apparatus to its periphery. Additionally, the exhaust manifold 81 is connected to an acid-exhaust system 122 exclusive in the factory, providing the junction of various exhaust gases previous to the acid-exhaust system.

The exhaust manifold 81 is provided with a concentration sensor (not shown) for detecting the concentration of ozone. The concentration sensor on the exhaust manifold 81 is connected to the CPU 100 as the controller. The detection signal is transmitted from the concentration sensor to the CPU 100. Then, on receipt of the ozone concentration from the concentration sensor, the CPU 100 grasps the capability of the ozone killer 80 to eliminate the ozone. For example, the CPU 100 monitors whether the ozone gas 2 is now leaking out due to malfunctions of the ozone killer 80.

As mentioned above, in the drain pipeline 91 extending from the processing container 10, there are interposed the valve V9, the supplement valve V10 connected in parallel with the valve V9, the cooling part 92 and the mist trap 95. The above ozone killer 80 is connected to the exhaust pipeline 110 forming the exhaust system of the mist trap 95. The interior exhausting means 60 is arranged so as to extend from the processing container 10 and also bypass the mist trap 95. Additionally, the interior exhausting means 60 is provided with a forcible-exhaust pipeline 62 which forcibly sucks gas in the processing container 10 through the ejector (forcible-exhaust mechanism) 63 and further returns the above gas to the side of the exhaust port of the mist trap 95.

The interior exhausting means 60 mainly comprises an exhaust part 61 in the container 10, the forcible-exhaust pipeline 62 connecting the exhaust part 61 with the exhaust pipeline 110, a first exhaust valve V13 interposed in the pipeline 62, and the forcible-exhaust mechanism 63 interposed in the pipeline 62 on the downstream side of the first exhaust valve V13 and also equipped with the ejector. Additionally, the lower part of the container 10 is communicated with the forcible-exhaust pipeline 62 on the downstream side of the first exhaust valve V13 through a supplement exhaust pipeline 68 which includes a check valve CV2 for releasing an atmosphere in the processing container 10 if a pressure therein is elevated abnormally. On the upstream side of the first exhaust valve V13, the forcible-exhaust pipeline 62 is connected with the exhaust pipeline 110 between the ozone killer 80 and the manifold 81, through a branch exhaust pipeline 64 that includes a second exhaust valve V14, a damper 65 and an exhaust pipeline 64a for exhausting a casing 71 (see FIG. 1).

Owing to the connection with the CPU 100, respective operations of the first exhaust valve V13, the second exhaust valve V14 and the damper 65 are controlled on the basis of the control signals from the CPU 100.

Making use of a negative pressure produced by introducing air into a part of the forcible-exhaust pipeline 62, the air being supplied from the air source 55 of the air supplier 50, the forcible-exhaust mechanism 63 is constructed to allow both steam and ozone gas to be sucked and discharged from the container 10 forcibly. The forcible-exhaust mechanism 63 is connected to the CPU 100 as the controller. Thus, the operation of the mechanism 63 is controlled on the basis of the control signals from the CPU 100.

The discharging means 70 includes the casing 71 surrounding the processing container 10 and a drain pipeline 72 having one end connected to the lower part of the casing 71 and the other end connected to the factory acid-drain system 123 (ACID DRAIN).

In this arrangement, the casing 71 is supplied with fresh air which flows from the upside of the casing 71 downwardly. By the downward-flowing air, it is possible to prevent an atmosphere inside the casing 71, in other words, the atmosphere in the periphery of the container 1 from leaking out. Further, the downward-flowing air allows the above atmosphere to be urged downwardly thereby to enter into the exhaust pipeline 64a and the drain pipeline 72 with ease. Note, the casing 71 is also provided with a concentration sensor (not shown) as a peripheral concentration detector for detecting the concentration of ozone in the peripheral atmosphere around the processing container 10. This concentration sensor is connected to the CPU 100. In operation, the detection signal from the concentration sensor is transmitted to the CPU 100, allowing a leakage of the ozone gas 2 to be detected on the basis of the ozone concentration detected by the sensor.

Connected to the drain pipeline 72 is a drain pipe 67 that allows of passage of a drained liquid which has been separated by a mist separator 66 interposed in the forcibly-exhaust pipeline 62 on the downstream side of the forcibly-exhausting mechanism 63. A closing valve V15 is interposed in the drain pipe 67. The drain pipeline 72 is also connected to the mist trap 95 through a second drain pipeline 93.

Next, the operation of the substrate processing apparatus of this invention will be described. Table 1 shows a sequential control method by the control unit.

First, it is carried out to deliver a plurality of wafers W (e.g. fifty wafers) transferred by the not-shown wafer transfer means to the wafer guide 20 rising upward of the container body 11 of the processing container 10. Subsequently, after the wafer guide 20 has been lowered, the container cover 12 is closed to accommodate the wafers W in the processing container 10 closely.

(a) Wafer Heating Process (Substrate Heating Process)

Under condition of accommodating the wafers W in the processing container 10, the closing valves V5, V6 of the air supplier 50 and the second exhaust valve V14 are opened by the control unit, in order to supply the processing container 10 with hot air. Then, the hot-air generator 52 is operated to supply the processing container 10 with the hot air heated at approx. 280° C., so that the wafers W and the atmospheric temperature of the processing container 10 are heater from a room temperature (25° C.) to a designated temperature (e.g. 80 to 90° C.). (Process (1) of Table 1)

In the wafer heating process, as shown in the process (1) of Table 1, the control unit allows the closing valve V9 and the supplement closing valve V10, both of which are interposed in the drain pipeline 91 extending from the processing container 10, close thereby to prevent gas or mist from flowing from the mist trap 95 into the processing container backward. That is, in this wafer heating process, the processing container 10 is supplied with hot air and also exhausted through the branch exhaust pipeline 64 extending therefrom and also joining at the downstream side of the ozone killer 80. During this wafer heating process, it is required to adjust a pressure of the steam generator 33 during its stand-by operation so as to be higher than a pressure inside the processing container 10. Thus, since the closing valve V2 is opened in the above process of adjusting the pressure thereby to discharge a part of steam in the steam generator 33 into the mist trap 95 through the exhaust pipeline 39, the pressure in the mist trap 95 becomes higher than that in the processing container 10. Nevertheless, since the closing valve V9 and the supplement closing valve V10 are together closed, there is produced no backflow.

TABLE 1

| Process | Valve | | | | | | | | | | | |
|---|---|---|---|---|---|---|---|---|---|---|---|---|
| | V1 | V2 | V4 | V5 | V6 | V7 | V8 | V9 | V10 | V13 | V14 | V16 |
| (1) Heating of wafers (Supply of Hot Air) | C | O or C | C | O | O | C | C | C | C | C | O | C |
| (2) pre-pressurizing | C | O or C | C | C | C | C | C | C | O | C | C | C |
| (3) O3/ vaporizing | O | C | O | C | C | C | C | C | O | C | C | C |
| (4) O3-O2 replacement | C | O or C | O | C | C | C | C | C | O | C | C | C |
| (5) Exhausting of ejector | C | O or C | C | C | O | C | O | C | C | O | C | O |
| (6) Just after completion of forced exhausting | C | O or C | C | C | O | O | C | C | C | C | C | C |
| (7) Air-purge | C | O or C | C | C | O | O | C | O | C | C | C | C |

In Table, alphabet "O" indicates an opened state, while "C" does a close state.

(b) Pressurizing Process

Next, it is executed to apply high-frequency voltage on oxygen ($O_2$), which has been supplied from the ozone-gas generator 41 forming the ozone-gas supplying means, thereby to produce the ozone gas ($O_3$). The control unit allows the supplement valve V10 and the closing valve V4 to open (the closing valve V9 to close) thereby to supply the processing container 10 with the ozone gas 2, so that the atmosphere in the processing container 10 is preliminary compressed (Process (2) of Table 1). Then, by supplying the ozone gas 2 having approx. 9% wet (volume percentage) in ozone concentration with the flow rate of approx. 10 liter/minute, it is possible to make the pressure in the processing container 10 higher than the atmospheric pressure upon zero-adjustment (0.1 MPa) by 0.01 to 0.3 MPa. Consequently, since the processing container 10 is filled up with the atmosphere of the ozone gas 2 only, stable oxidation films are formed on the surfaces of the wafers W, preventing the metallic corrosion.

(c) O3/Vaporizing Process

After completing the preliminary pressurizing of the processing container 10 for a predetermined period (e.g. one to two minutes), ozone-gas supplying means, i.e. the ozone-gas generator 41 is driven to supply the ozone gas through the closing valve V4, while the steam supplier 30 is also driven and the first closing valve V1 is opened to supply the steam 1 into the processing container 10 thereby to perform a process for the wafers W, in other words, a process for removing the resist by means of reactive substances resulting from the reaction of the stream 1 (solvent vapor) with the ozone gas (Process (3) in Table 1). During this operation, in a period from the operational start of the steam supplier 30 till the supply of steam into the processing container 10, it is carried out to compare a pressure value P1 of the pressure sensor PS1 in the processing container 10 and a pressure value P2 of the pressure sensor PS2 in the steam generator 33. If the pressure in the processing container 10 is higher than that in the steam generator 33 (P1>P2), then it is executed to control the closing/opening operations of the closing valves V1, V2 so that the processing container 10 can be supplied with the steam due to an elevation in the pressure in the steam generator 33 (P1<P2). In detail, while monitoring the pressure in the steam generator 33 by the pressure sensor PS2, it is executed to close the closing valves V1, V2 until a first pressure value Px. Consequently, the amount of steam in the steam generator 33 is gradually increased to reach the first pressure value Px. Then, while maintaining the closing valve V1 in the closed state, the closing valve V2 is opened for a regular period (for example, one second), so that a pressure (steam) in the steam generator 33 is released and lowered to a second pressure value Py. Note, since an orifice 39a is interposed in the exhaust pipeline 39, it is possible to restrict an abrupt reduction in the pressure in the steam generator 33. Further, by repeating the above operation (control) while closing the closing valve V1, the pressure in the steam generator 33 is maintained between the pressure value Px and the pressure value Py until the supply of the processing container 10 with the steam. Noted, the first pressure value Px and the second pressure value Py are together established higher than the pressure value P1 and therefore, there is established a relationship of P1<Py<Px. As to the control after the beginning of supplying the processing container 10 with steam, it is firstly executed to open the closing valve V1 and close the closing valve V2 by the CPU 100. Then, since a pressure value in the steam generator 33 is between the pressure value Px and the pressure value Py, the steam flows into the processing container 10 easily and instantly. Moreover, since the steam has been generated in the steam generator 33 in large quantities, a large quantity of steam flows into the processing container 10 at a stretch and is mixed with the ozone gas supplied into the processing container 10 in advance, allowing of a quick initiation of the processing of the wafers W. Again, as the temperature of the steam is high due to such a high pressure in the steam generator 33, it is possible to perform a processing using the ozone gas in the atmosphere of high temperature, accomplishing the improvement in processing capability. During the supply of both steam and ozone gas into the processing container 10, the closing valve V10 is controlled in its opened state and a pressure loss is formed at the flow regulating part on the upstream side of the closing valve V10. In this way, while maintaining a pressure in the processing container higher than the atmospheric pressure, it is performed to remove the resist from the wafers W.

Although the relationship of P1<P2 is established in the supply of steam in the above-mentioned embodiment, needless to say, even a relationship of P1=P2 allows the steam to be supplied to the processing container 10 as long as the steam generator 33 produces the steam, substantially. In connection, if the CPU 100 previously stores data of pressure in the processing container 10 at processing and additionally, the opening/closing operations of the first and second closing valves V1, V2 are controlled on a basis of the above pressure data and a pressure detected by the pressure sensor PS2, then it is possible to supply the steam 1 of pressure equal to or more than a pressure in the processing container 10. Thus, by increasing the quantity of mixed ozone molecular in relation to a layer of water molecular, it is possible to increase the quantity of hydroxyl radicals, thereby improving the removal ability for resist.

(d) Replacing Process of O3 with O2

After completing the process in the processing container 10 for a predetermined period (e.g. three to six minutes) under a pressure higher than the atmospheric pressure (0.1 MPa) on zero-adjustment by e.g. approx. 0.05 MPa, though the pressure may be modified depending on the sorts of resist, the first closing valve V1 is closed to stop the supply of steam from the steam supplier 30 and further, the drive of the ozone-gas generator 41 is stopped to supply the processing container 10 with only oxygen ($O_2$) in the base gas and also purge the interior of the pipeline with the base gas, thereby preventing abrupt reductions in pressure and humidity in the processing container 10 (Process (4) in Table 1). Therefore, it is possible to prevent the dewdrops of the steam in the processing container 10 from falling and sticking to the wafers W.

(e) Forced Exhausting Process

After supplying oxygen for a predetermined period (e.g. one minute), the supply of oxygen is stopped and continuously, the closing valve 16 is opened to operate the ejector 63 of the forced exhausting mechanism. While, the exhaust valve V13 and the closing valves V6, V8 are together opened to forcibly suck the steam and the ozone gas remaining in the processing container 10, for exhausting (Process (5) in Table 1). In this case, since the processing container 10 can be exhausted in suction since the ejector 63 is formed so that the flow rate flowing from the processing container 10 toward the ejector 63 becomes somewhat larger than the flow rate of air flowing through the air pipeline 51B and the processing container 10 is slightly reduced in pressure, it is possible to rapidly perform the exhausting of area, which has been purged with difficulty by only the exhaust gas squeezed out at the later-mentioned air-purge process.

Also in the forced exhausting process, the exhaust pipeline 110 to which the ejector 63 is connected and also the mist trap 95 exhibit high pressure. In this forced exhausting process, as shown in the process (5) of Table 1, the control unit closes the closing valve V9 and the supplement valve V10 both interposed in the drain pipeline 91 extending from the processing container 10 in order to prevent a backflow of gas or moisture from the mist trap 95 into the processing container.

(f) Process Just After Completing Forced Exhausting

By the control unit, the closing valve V9 and the supplement valve V10 interposed in the drain pipeline 91 extending from the container 10 to the mist trap 95 are closed in a slight period (for example, two to three seconds) just after the completion of the forced exhausting process (at completion, valve V8: closed; valve V6: opened). Under such a situation, the closing valve V7 is opened to supply the processing container 10 with cooled air in the air-purge process (Process (6) in Table 1).

The reason of cooled air is as follows. Just after completing the forced exhausting process, namely, for a period (two to three seconds) between the start of the air-purge process and the end of the ejector exhausting process, there still remains a gas that has not passed through the ozone killer 80 yet. Due to the presence of gas, a space from the ozone killer 80 to the mist trap 95 has a high pressure, while the processing container 10 is brought into a slightly-decompressed state. Accordingly, since the pressure in the mist trap 95 becomes higher than the pressure of the processing container 10 until its interior forcibly exhausted in suction is filled up with the cooled air in the air-purge process-vacuum condition, either gas or mist flows backward from the mist trap 95 into the processing container 10 under condition that the exhaust pipeline from the processing container 10 into the mist trap 95 still opens. Therefore, just after completing the ejector exhausting process, the drain pipeline 91 from the container 10 to the mist trap 95 is closed in a slight designated period, thereby preventing the occurrence of backflow.

(g) Air-Purge Process

Finally, the closing valve V9 in the drain pipeline 91 is opened and the closing valves V6, V7 in the purge-air pipeline 51A are opened from a moment just after the end of the forced exhausting process thereby to supply the processing container 10 with cooled air. In this way, after exhausting the processing container 10, the air-purge process is ended. (Process (7) in Table 1).

Thereafter, the elevating mechanism 15 is operated to raise the container cover 12. Thus, after opening the loading/unloading port 14 of the container body 1, the wafer guide 20 is raised to unload the wafers W to the upside of the container 10. Then, the wafers W are delivered to a not-shown wafer transfer unit. On receipt of the wafers W, the transfer unit transfers them to the next cleaning part using pure water or the like. At the cleaning part, the resist is washed away from the wafers W.

Accordingly, not only does the invention apply the above-mentioned substrate processing method to the removal of resist from the wafers W requiring the wiring process, the prevention of metallic corrosion to the same wafers W and the prevention of particles' adhesion to the same wafers W, but the above-mentioned substrate processing method is applicable to the removal of resist from the other wafers W requiring no wiring process, the prevention of metallic corrosion to the same wafers W and the prevention of particles' adhesion to the same wafers W.

Figure 19:
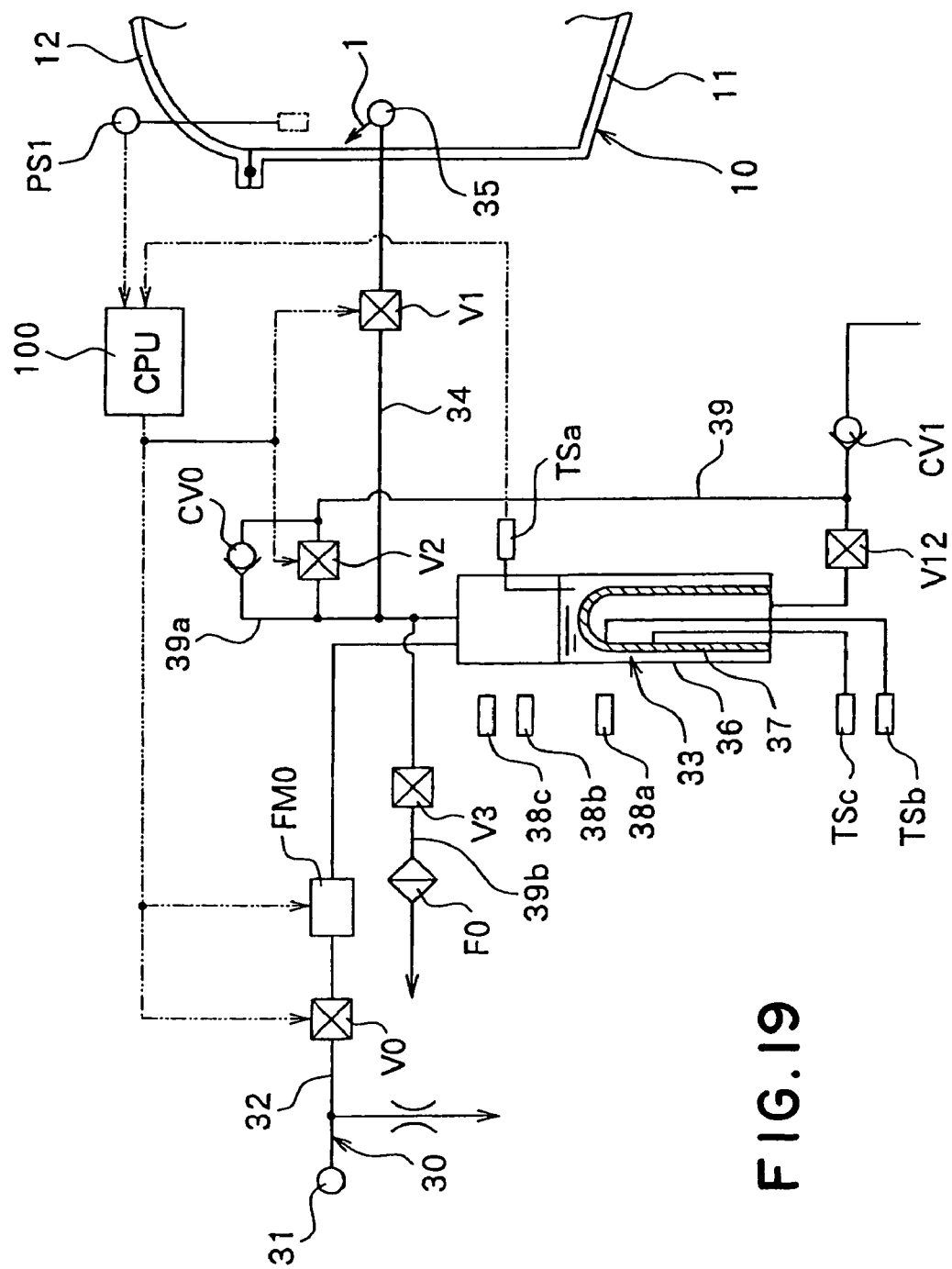
FIG. 19 is a schematic sectional view showing of the solvent-vapor generating means in accordance with the second embodiment of the invention.

In the above-mentioned embodiment, it is carried out to detect a pressure of the steam generated by the steam generator 33. Then, on the basis of the so-detected pressure, it is further executed to control a timing of supplying the steam 1 into the container 10 and a quantity of the steam 1 to be supplied into the container 10. In the modification, the above detection of pressure may be replaced by detecting a temperature of water (as the liquid solvent) in the steam generator 33, in view of controlling both supply-timing and quantity of the steam to be supplied into the processing container 10. In this modification, as shown in FIG. 19, the steam generator 33 is provided, on the upper side in the tank 36, with a first temperature sensor TSa which detects a temperature of water in the tank 36. In operation, the first temperature sensor TSa detects a boiling temperature of the water. Then, the detection signal of the sensor TSa is transmitted to the CPU 100. On receipt of the detection signal, the CPU 100 compares the detected boiling temperature with pressure data memorized on the basis of various boiling temperatures in advance and further generates signals to control the opening/closing operations of the valves V1, V2. In this embodiment, it is established that the higher the boiling temperature is elevated, the more the steam 1 to be supplied into the container 10 is increased. Consequently, since the first and second valves V1, V2 are controlled on the comparison between the pressure in the processing container 10 and the boiling temperature of water in the steam generator 33, it is possible to supply the processing container 10 with the steam 1 of a pressure equal to and more than the pressure of the processing container 10.

Repeatedly, as the pressure data in the container 10 at processing is previously stored in the CPU 100 and the operations of the valves V1, V2 are controlled on the basis of the above pressure data and the detection temperature detected by the first temperature sensor TSa, it is possible to supply the steam 1 of a pressure equal to and more than the pressure of the processing container 10. In other words, since the number of ozone molecules mixed into a layer of water molecules is increased, it is possible to increase the quantity of hydroxyl radicals, thereby improving the removal ability for resist.

Note, in the second embodiment of FIG. 19, the other elements are identical to those in the first embodiment and therefore, the identical elements are indicated with the same reference numerals respectively and their descriptions are eliminated.

Although the steam nozzles 35 each includes the nozzle body 35a in the form of a pipe and the heater 35h inserted into the nozzle body 35a in the afore-mentioned embodiment, the steam nozzle 35 may be modified to a steam nozzle 35A having no heater, as shown in FIGS. 17A, 17B and 17C.

Similarly to the nozzle 35, as shown in FIG. 17A, 17B and 17C, the steam nozzle 35A mainly includes a pipe-shaped nozzle body 35k having a number of nozzle orifices 35f formed at regular intervals and an inner pipe 35m inserted into the nozzle body 35k through a clearance and also connected to a steam generator (not shown). The steam nozzles 35A in pairs are juxtaposed beside the plural (e.g. fifty) wafers W accommodated in the processing container 10, as similar to the above nozzles 35. Further, the nozzles 35A are arranged so that the nozzle orifices 35f exist at least within an area to arrange the wafers W. In detail, all the nozzle orifices 35f are positioned at least inside the outermost wafers on both sides of the wafers W in block.

In opposition to the nozzle orifices 35f in the nozzle body 35k, the inner pipe 35m has a plurality of communication holes 35p formed at regular intervals longer than the intervals of the nozzle orifices 35f. Each of the communication holes 35p is formed to have a diameter larger than that of the nozzle orifice 35f. In this way, owing to the provision of the communication holes 35p, the steam supplied from the steam generator to the inner pipe 35m enters into the clearance between the nozzle body 35k and the inner pipe 35m through the communication holes 35p and subsequently, the steam is ejected against the inner wall of the container 10 via the nozzle orifices 35f. Accordingly, it is possible to accomplish the uniform ejection of the steam through the nozzle orifices 35f.

Besides the communication holes 35p, the inner pipe 35m has a plurality of (e.g. three) communication small holes 35q formed, beyond the area of the wafers' arrangement, on the side of a leading bottom of the pipe 35m and also arranged in the circumferential direction of the pipe 35m. Each communication small hole 35q has a diameter generally equal to the diameter of each nozzle orifice 35f. The central communication small hole 35q is arranged to extend in the vertical direction, while two remaining communication small holes 35q are formed in respective positions at an angle of 45 degrees with the vertical direction.

On the other hand, the nozzle body 35k has a plurality of (e.g. five) drain holes 35n formed, beyond the area of the wafers arrangement, on the side of a leading bottom of the body 35k and also arranged in the circumferential direction of the body 35k. Each drain holes 35n has a diameter generally equal to the diameter of each communication small hole 35q. Further, the drain holes 35n are arranged so as to face the communication small holes 35q. The central drain hole 35n is arranged to extend in the vertical direction, while four remaining drain holes 35n are formed in respective positions at an angle of 22.5 or 45 degrees with the vertical direction.

Owing to the provision of the drain holes 35n on the side of the leading end of the nozzle body 35k, the dewdrops, which have been collected on respective bottoms of the nozzle body 35k and the inner pipe 35m as a result of powerful ejection of the steam through the communication holes 35p and the communication small holes 35q of the inner pipe 35m, are urged toward the leading end of the nozzle body 35k. That is, since the dewdrops are easily collected to the leading end of the nozzle body 35k, it is possible to discharge the dewdrops from the leading end of the nozzle body 35k with ease. According to the arrangement, since the nozzle bodies 35 in pairs are juxtaposed beside the wafers W in the container 10 and the drain holes 35n are positioned beyond the area of the wafers' arrangement (outside the outermost wafer), even if dewdrops falling from the holes 35n are blown up by air current produced in the container 10, the dewdrops can be prevented from contact with the wafers W, also avoiding the drops' adhesion to the wafers W. Additionally, owing to the provision of the drain holes 35n of the plural number (five in the drawing), even if changing the angle of the nozzle orifices 35f with the processing container 10, either one of the drain holes 35n could be brought into the lowermost position of the nozzle body 35k, accomplishing the discharge of dewdrop water effectively.

Since the communication small holes 35q are opposed to the drain holes 35n, the steam ejected from the holes 35q is directly discharged from the nozzle body 35k through the drain holes 35n. Therefore, due to this direct discharge, it is possible to drain the dewdrop water collected on the bottoms of the inner pipe 35m and the nozzle body 35k, positively.

Figure 18:
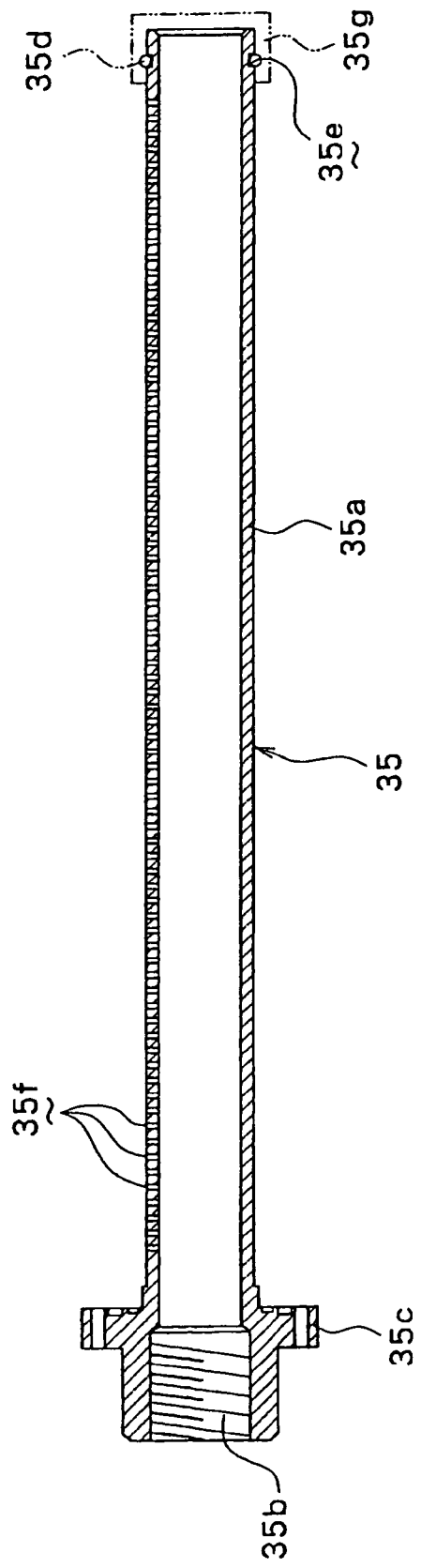
FIG. 18 is a sectional view showing the steam nozzle of the invention.

As a simpler steam nozzle that is not equipped with the heater 35h, there is provided a steam nozzle indicated with reference numeral 35B of FIG. 18. As shown in the figure, the steam nozzle 35B has the pipe-shaped nozzle body 35a which is provided, on one end thereof, with the attachment flange 35c and the female screw part 35b for connection with the steam pipeline 34. Further, on the circumference of the leading end of the nozzle body 35a, the fitting groove 35e is formed for engagement with an O-ring 35d. The nozzle 35A further a number of steam ejection orifices 35f formed on the side wall of the body 35k at appropriate intervals.

Returning to FIG. 2A, although the shown container cover 12 is formed to have a reverse V-shaped section contoured by the downward-inclined faces 13, the container cover of the invention is not limited to this configuration. For example, as shown in FIG. 20, the cover may be formed to have a reverse U-shaped section.

Additionally, although the above-mentioned embodiment relates to an example of processing the wafers W as the substrates to be processed, the apparatus and method in accordance with the invention are applicable to remove the resist from other substrates, for example, liquid crystal display (LCD) substrates.

What is claimed is:

1. A substrate processing method comprising the steps of:
    placing a substrate in a processing container;
    supplying a processing gas into the processing container to establish, within the processing container, an atmosphere of the processing gas having a first pressure higher than atmospheric pressure;
    generating a solvent vapor in a solvent vapor generator with fluid communication between the solvent vapor generator and the processing container being disconnected while monitoring, by using a sensor, the pressure of the solvent vapor in the solvent vapor generator;
    comparing the pressure in the solvent vapor generator with pressure in the processing container supplied with the processing gas; and
    based on the comparison result, connecting the fluid communication between the solvent vapor generator and the processing container, thereby supplying the solvent vapor from the solvent vapor generator into the processing container in which the atmosphere of the processing gas having the first pressure has been established, when the monitored pressure in the solvent vapor generator is higher than the pressure in the processing container supplied with the processing gas,
    wherein the solvent vapor is water vapor, the solvent vapor generator being configured to heat water contained therein to generate water vapor, and wherein the processing gas is ozone gas.

2. A substrate processing method as claimed in claim 1, wherein the step of monitoring the pressure in the solvent vapor generator is carried out by firstly measuring temperature of the solvent vapor in the solvent vapor generator using a temperature sensor and secondly calculating the pressure in the solvent vapor generator based on the measured temperature.

3. A substrate processing method as claimed in claim 1, wherein the step of monitoring the pressure in the solvent vapor generator is carried out by firstly measuring temperature of a liquid solvent before vaporized in the solvent vapor generator using a temperature sensor and secondly calculating the pressure in the solvent vapor generator based on the measured temperature.

4. A substrate processing method of claim 1, further comprising the step of regulating pressure of the solvent vapor before the solvent vapor is supplied into the processing container, to a second pressure higher than the first pressure of the processing gas in the processing container.

5. A substrate processing method as claimed in claim 4, wherein the step of regulating pressure of the solvent vapor includes a step of discharging an amount of solvent vapor from a closed space filled with the solvent vapor to be supplied into the processing container in order to prevent the second pressure from exceeding a predetermined upper limit value.

6. A substrate processing method of claim 1, wherein the step of monitoring the pressure in the solvent vapor generator is performed using a pressure sensor.

7. A substrate processing method of claim 1, further comprising a step of monitoring the first pressure in the processing container, wherein, during the performance of the comparing step, the monitored first pressure in the processing container and the monitored pressure in the solvent vapor generator are compared.

* * * * *